United States Patent
Kumagai

(10) Patent No.: US 6,243,284 B1
(45) Date of Patent: Jun. 5, 2001

(54) MULTIVALUED MASK READ-ONLY MEMORY

(75) Inventor: Kouichi Kumagai, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/498,115

(22) Filed: Feb. 4, 2000

(30) Foreign Application Priority Data

Jul. 9, 1999 (JP) .................................................. 11-196765

(51) Int. Cl.[7] .................................................. G11C 17/00
(52) U.S. Cl. ............................ 365/104; 365/94; 365/120; 365/189.07
(58) Field of Search .............................. 365/120, 189.11, 365/189.07, 190, 203, 103, 94

(56) References Cited

U.S. PATENT DOCUMENTS

| | | | |
|---|---|---|---|
| 5,556,800 | * | 9/1996 | Takizawa et al. ................... 437/45 |
| 5,650,959 | * | 7/1997 | Hayashi et al. ..................... 365/182 |
| 5,680,343 | * | 10/1997 | Kamaya ............................. 365/104 |
| 6,088,265 | * | 7/2000 | Ohta ................................ 365/185.16 |

FOREIGN PATENT DOCUMENTS 8297982 11/1996 (JP) ................................ G11C/16/04

* cited by examiner

*Primary Examiner*—David Nelms
*Assistant Examiner*—Thong Le
(74) *Attorney, Agent, or Firm*—Hayes, Soloway, Hennessey, Grossman & Hage, P.C.

(57) ABSTRACT

A multivalued mask ROM is configured by arranging cell transistors in a matrix form, which is defined by wiring word lines and ground lines in rows and by wiring bit lines in columns. Each of the cell transistors is encompassed by a word line, a ground line and at least two bit lines. Herein, gates of the cell transistors which align in a same row are connected with a same word line, while sources and drains of the cell transistors are adequately connected or disconnected with the ground line and bit lines. In an integrated circuit, contacts are formed between n+ regions, first-layer metal and second-layer metal on a well region to establish connections by which the source and drain of the cell transistor are adequately connected with the ground line and/or bit lines. That is, ROM codes are formed using the contacts. A circuitry is provided for the multivalued mask ROM to read out stored information of the cell transistors in synchronization with a clock signal. In Low-level duration of the clock signal, the circuitry performs precharge to a first bit line and pull-down to a second bit line. In High-level duration of the clock signal, the circuitry stops the precharge and pull-down while activating the word line to detect levels of the first and second lines, which are used as values for a two-bit code corresponding to stored information of the cell transistor.

19 Claims, 18 Drawing Sheets

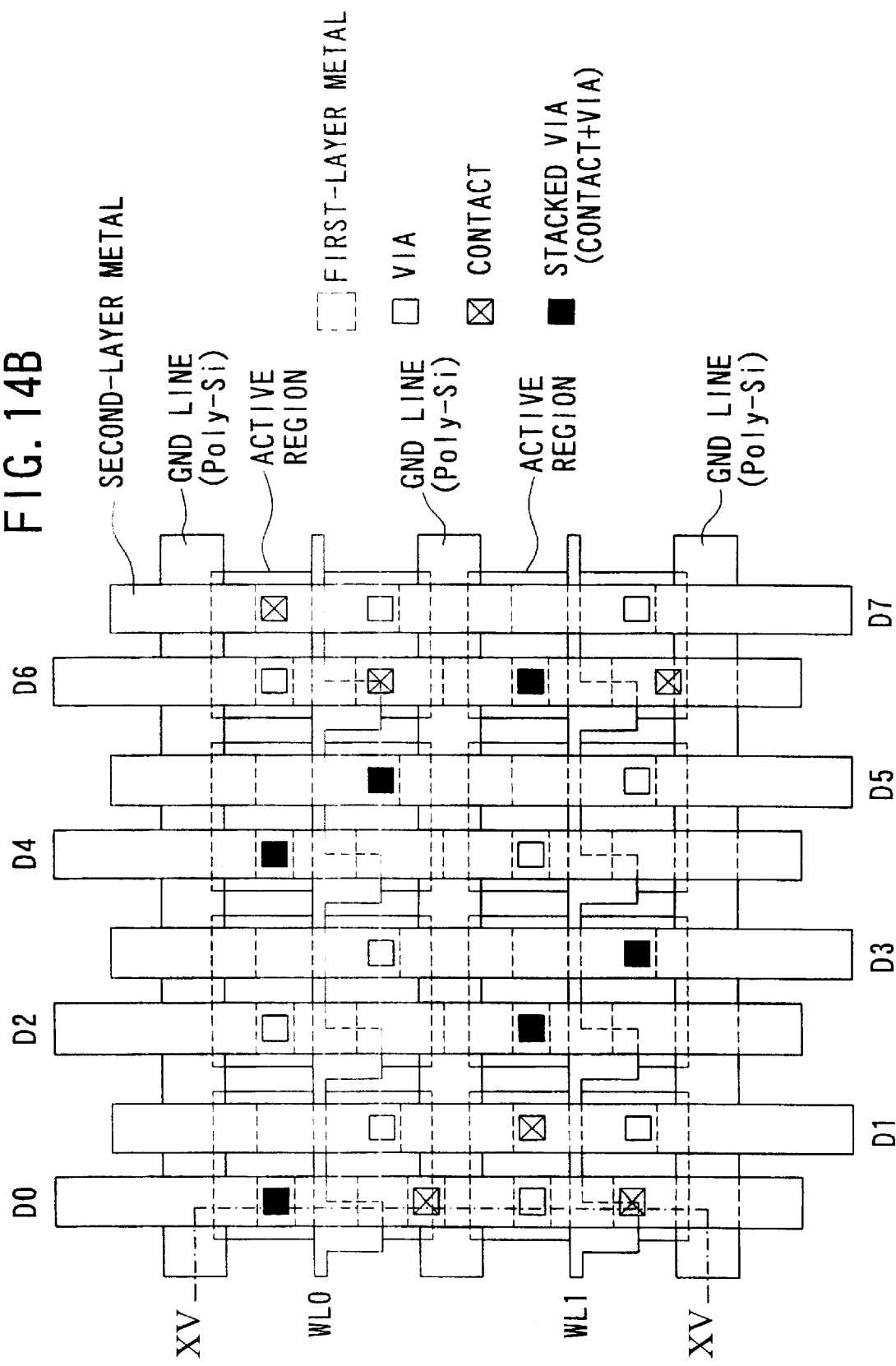

MULTIVALUED MASK READ-ONLY MEMORY

BACKGROUND OF THE INVENTION

1. Field of the Invention

This invention relates to multivalued mask read-only memories that are designed to store information of multiple bits in a single memory cell.

This application is based on Patent Application No. Hei 11-30680 and Patent Application No. Hei 11-96765 both filed in Japan, the contents of which are incorporated herein by reference.

2. Description of the Related Art

In general, technology of multivalued cells each storing information of multiple bits is known to actualize large capacities for read-only memories (or ROMs). Japanese Patent Application, First Publication No. Hei 8-297982 discloses an example of a multivalued mask ROM, in which codes are written to a ROM in manufacture by changing thresholds (Vt) of cell transistors. FIG. 9 is a circuit diagram showing a part of a cell array used for the aforementioned multivalued mask ROM. Herein, thresholds Vt0, Vt1, Vt2, Vt3 are respectively set to transistors M00, M10, M01, M11, wherein those thresholds differ from each other in accordance with a relationship of $Vt0<Vt1<Vt2<Vt3$. For example, a word line WL0 is selected and is changed in electric potential by three steps as shown FIG. 10 from zero level to a prescribed level. Thus, it is possible to read out 2-bit information from the transistor M00 or M01.

In order to change ROM codes of the multivalued mask ROM in manufacture, the thresholds Vt are changed by changing channel ion implantation to the cell transistors.

However, the aforementioned technique suffers from problems, as follows:

A first problem is caused by formation of ROM codes, which are formed by the channel ion implantation before formation of gates. At revision of the ROM codes, it is necessary to change masks in lower layers of integrated circuits. Such changes variously influence post-processes in manufacture of the integrated circuits, so it takes a great number of days in designing the masks and in manufacturing the integrated circuits. For this reason, it takes a longer turnaround time (or TAT) for revision.

A second problem is that the revision of the ROM codes needs a great number of modified masks. In case of a four-valued (or 2-bit) mask ROM, for example, it is necessary to modify at least two masks.

In a method in which ROM codes are written in response to magnitude of the thresholds Vt, it is necessary to change impurity density with respect to each of the cell transistors. In the case of the four-valued mask ROM, it is necessary to perform ion implantation two times, that is, it is necessary to perform ion implantation corresponding to Vt1 and ion implantation corresponding to Vt2 respectively. Herein, an amount of the ion implantation corresponding to Vt2 is greater than an amount of the ion implantation corresponding to Vt1.

Specifically, first ion implantation corresponding to Vt1 is performed with respect to the cell transistors corresponding to Vt1, Vt3 by using a first mask, and second ion implantation corresponding to Vt2 is performed with respect to the cell transistors corresponding to Vt2, Vt3 by using a second mask.

As described above, the ion implantation is performed two times on the cell transistor corresponding to Vt3, which has a largest amount of ion implantation and a highest impurity density. In addition, ion implantation is not performed on the cell transistor corresponding to Vt0, which has a lowest impurity density. Thus, using two masks, it is possible to establish a relationship in impurity density in which $Vt0<Vt1<Vt2<Vt3$.

A third problem is a limitation of integration of the integrated circuits due to an alignment accuracy of ion implantation and spread diffusion of impurities. This is because heat treatment corresponding to the post-process of the ion implantation broadens impurities-diffused regions so that it is impossible to reduce gate pitches so much.

In order to form cell transistors, having different thresholds, to adjoin each other in a same active region, the known CMOS process (where "CMOS" is an abbreviation for "Complementary Metal-Oxide Semiconductor") in mass production provides a gate length of 0.25 $\mu$m with a minimum gate pitch of 0.5 $\mu$m or so. Such a minimum gate pitch is determined by the alignment accuracy of the ion implantation and the spread diffusion of impurities. For this reason, it will not be reduced so much even if fine manufacture of the CMOS process is developed.

A fourth problem is complication in potential control of the word line(s) to read out codes stored in cells. That is, the aforementioned method that changes thresholds uses a number of different thresholds, which is identical to a number of states being stored in one cell. To discriminate them, it is necessary to control the word line to be at each of different potential levels, a number of which is smaller than the number of states being stored in one cell by "1". In the case of the four-valued mask ROM, it is necessary to control the word line to be at each of "three" potential levels as shown in FIG. 10.

SUMMARY OF THE INVENTION

It is an object of the invention to provide a multivalued mask ROM which is reduced in turnaround time for revision of ROM codes and which is also reduced in a number of modified masks being required for revision of ROM codes.

It is another object of the invention to provide a multivalued mask ROM, integration of which is improved.

It is a further object of the invention to provide a multivalued mask ROM, in which potential control can be made on word lines in a simple manner.

A multivalued mask ROM is configured by arranging cell transistors in a matrix form, which is defined by wiring word lines and ground lines in rows and by wiring bit lines in columns. Each of the cell transistors is encompassed by a word line, a ground line and at least two bit lines. Herein, gates of the cell transistors which align in a same row are connected with a same word line, while sources and drains of the cell transistors are adequately connected or disconnected with the ground line and bit lines. In an integrated circuit, contacts are formed between n+ regions, first-layer metal and second-layer metal on a well region to establish connections by which the source and drain of the cell transistor are adequately connected with the ground line and/or bit lines. That is, ROM codes are formed using the contacts.

A circuitry is provided for the multivalued mask ROM to read out stored information of the cell transistors in synchronization with a clock signal. In Low-level duration of the clock signal, the circuitry performs precharge to a first bit line and pull-down to a second bit line. In High-level duration of the clock signal, the circuitry stops the precharge to the first bit line and the pull-down to the second bit line.

In addition, the circuitry activates the word line to detect levels of the first and second lines, which are used as values for a two-bit code corresponding to stored information of the cell transistor. For example, a two-bit code (00) is determined as stored information of the cell transistor whose source and drain are not at all connected with the ground line and bit lines. In addition, a two-bit code (11) is determined as stored information of the cell transistor whose source and drain are respectively connected with the first and second bit lines.

Thus, it is possible to reduce TAT in manufacture for revision of the ROM codes, which are formed using the contacts. In addition, all the cell transistors have a single threshold, so it is unnecessary to perform ion implantation for changing thresholds. That is, it is possible to improve integration of the cell transistors in the multivalued mask ROM. Further, it is possible to perform potential control on the word lines in a simple manner because only two levels (e.g., High level and Low level) are required to control the word lines in potential.

BRIEF DESCRIPTION OF THE DRAWINGS

These and other objects, aspects and embodiments of the present invention will be described in more detail with reference to the following drawing figures, of which:

FIG. 14B is a plan view showing construction of the integrated circuit of FIG. 14A;

DESCRIPTION OF THE PREFERRED EMBODIMENTS

This invention will be described in further detail by way of examples with reference to the accompanying drawings.

[A] Embodiment 1

Figure 1:
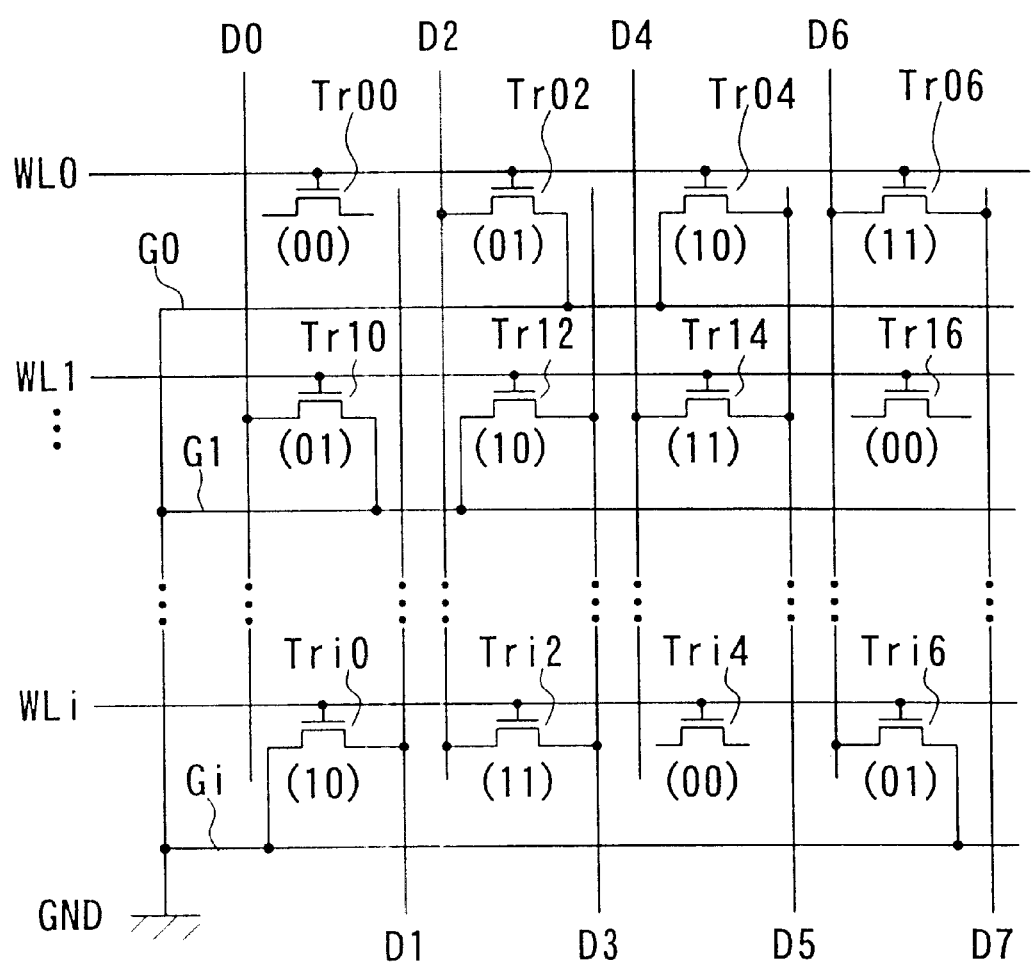
FIG. 1 is circuit diagram showing a configuration of a multivalued mask ROM in accordance with embodiment 1 of the invention.

FIG. 1 is a circuit diagram showing a configuration of a multivalued mask ROM in accordance with embodiment 1 of the invention. Specifically, FIG. 1 shows a memory cell array, which includes cell transistors Tr00, Tr02, Tr04, Tr06, Tr10, Tr12, Tr14, Tr16, . . . , Tri0, Tri2, Tri4 and Tri6 (where "i" is an integer). Herein, two bit lines (D) and one ground (GND) line are wired to encompass each cell transistor. That is, bit lines D0, D1, . . . , D7 are wired in vertical directions, while GND lines G0, G1, . . . , Gi are wired in horizontal directions.

For example, two bit lines D0, D1 and one GND line G0 are wired to encompass the cell transistor Tr00. In addition, two bit lines D2, D3 and one GND line G1 are wired to encompass the cell transistor Tr12. All of the GND lines G0, G1, . . . , Gi are connected together in ground potential level.

Unlike the aforementioned related art in which storing information is coded by changing threshold of each cell transistor, the multivalued mask ROM of the present embodiment is designed such that storing information is coded in response to conditions of connections by which the two bit lines and GND line are connected to source and drain of each cell transistor. For this reason, a same single value is set to thresholds of all the cell transistors in the multivalued mask ROM. Therefore, the present embodiment merely needs two levels of voltage (i.e., High level and Low level) being applied to gates of the cell transistors to read out codes.

In the present embodiment, the mask ROM is designed such that three lines (i.e., two bit lines, word line and GND line) are wired to encompass each cell transistor and are adequately connected to two terminals (i.e., source and drain) of the cell transistor. Herein, combinations of connections between three lines and two terminals of the cell transistor are represented by four conditions, i.e., (00), (01), (10) and (11), which are described as follows:

(00): None of the source and drain are connected to any of the lines.
(01), (10): One of the source and drain is connected to one bit line, while the other is connected to the GND line.
(11): The source and drain are connected to adjacent bit lines respectively.

Therefore, revision of the ROM codes can be accomplished by changing connections between the terminals of the cell transistors and their surrounding lines. In other words, it is possible to change the ROM codes by changing the wiring process.

In FIG. 1, word lines WL0, WL1, . . . , WLi are wired in proximity to the cell transistors. The word lines are wired in horizontal directions, so each of them is connected with gates of the cell transistors which are aligned in a horizontal direction. For example, the word line WL0 is connected with gates of the cell transistors Tr00, Tr02, Tr04, Tr06, while the word line WL1 is connected with gates of the cell transistors Tr10, Tr12, Tr14, Tr16.

As described above, the present embodiment requires only two levels of voltage (i.e., High level and Low level) being applied to the gates of the cell transistors. Therefore, the present embodiment requires only two levels of voltage being applied to the word lines.

Figure 2:
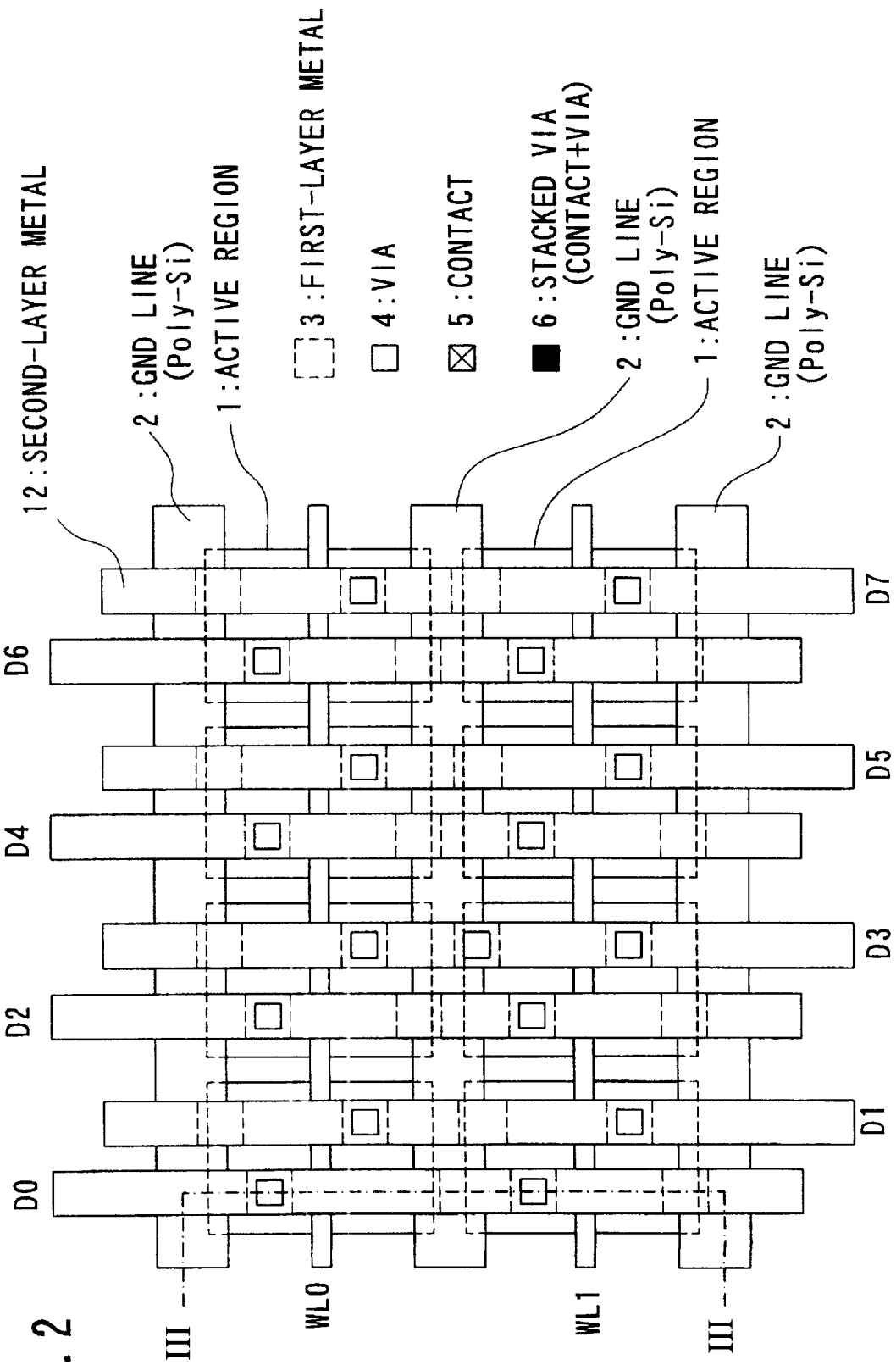
FIG. 2 is plan view showing construction of the multivalued mask ROM, which is manufactured as an integrated circuit and to which ROM codes are not written.

FIG. 2 is a plan view showing a configuration of the multivalued mask ROM of the present embodiment, which is formed as an integrated circuit (IC). Concretely speaking, FIG. 2 shows an initial condition of the mask ROM in which ROM codes are not at all formed. That is, sources and drains of all the cell transistors are not connected to lines in FIG. 2.

Active regions 1 are regions in which the cell transistors are formed and arranged. GND lines 2 are wired horizontally in upper and lower portions adjoining the active region 1, wherein they are formed of poly-silicon. In addition, the aforementioned word lines (WL0, WL1) are also formed of poly-silicon, wherein they traverse center portions of the active regions 1.

In FIG. 2, regions surrounded by dotted lines show first-layer metals 3. Some of the first-layer metals 3 are provided with vias 4. The aforementioned bit lines D0 to D7 are formed as second-layer metals 2. Because FIG. 2 shows the initial condition of the mask ROM in which ROM codes are not formed, contacts 5 and stacked vias 6 are not formed. Incidentally, the stacked via 6 is a region in which both of the via 4 and contact 5 are formed.

Figure 3:
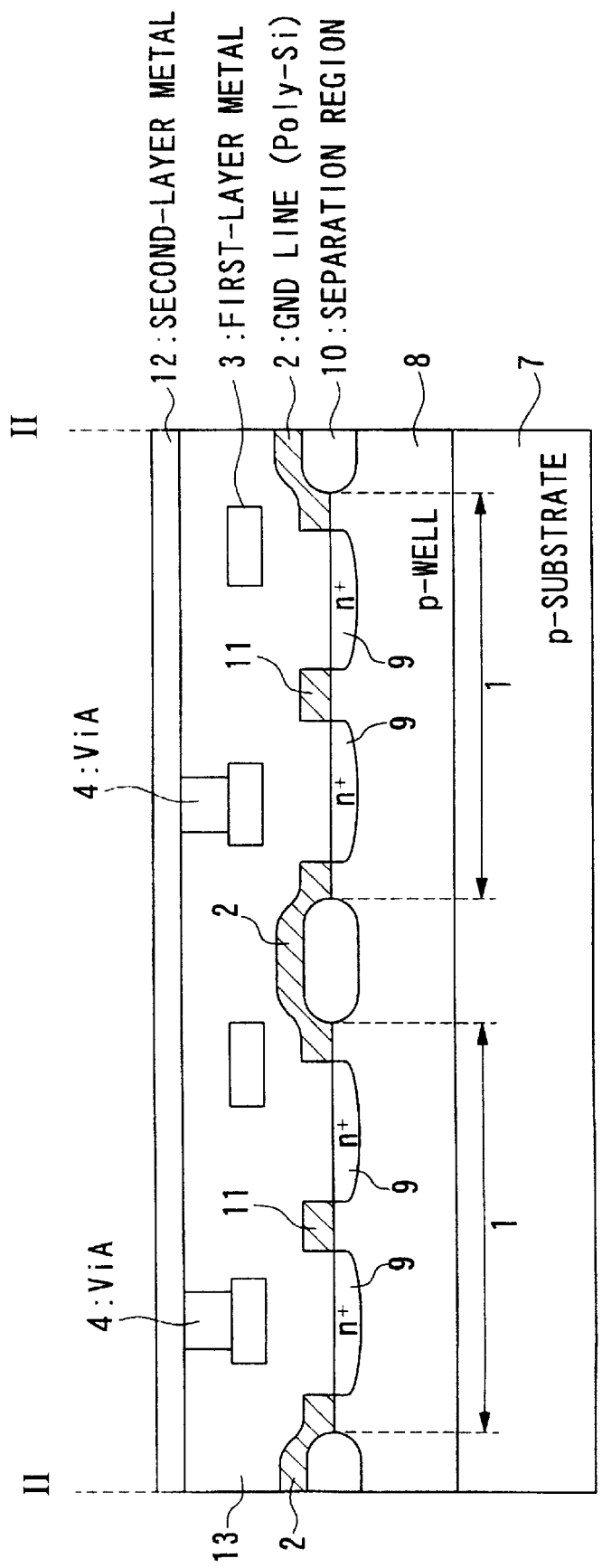
FIG. 3 is a cross sectional view taken along line III—III in FIG. 2.

FIG. 3 is a cross sectional view taken along line III—III in FIG. 2. Herein, a p-well 8 is formed as an upper layer on a p-substrate (or p-type substrate) 7. In addition, n+ regions 9 are formed in proximity to an upper surface of the p-well 8. In FIG. 3, two n+ regions 9 are formed in one active region 1, wherein one of them corresponds to a source region while the other corresponds to a drain region.

As described before, the present embodiment needs only a single value for the threshold of the cell transistor in the mask ROM. Therefore, no ion implantation is required to change the threshold. For this reason, it is unnecessary to provide a mask used for the ion implantation.

Further, a separation region 10 is provided between two active regions 1 which adjoin each other.

GND lines 2 made by poly-silicon are formed as upper layers on the separation regions 10. Gate electrodes 11 made of poly-silicon are formed on selected parts of the upper surface of the p-well 8, which are sandwiched between the source regions and drain regions. The gate electrodes 11 coincide with the word lines.

It is repeated that the present embodiment needs a single value for the thresholds of the cell transistors of the mask ROM, so no ion implantation is required to change the thresholds. Therefore, it is unnecessary to make consideration with respect to the alignment accuracy of the ion implantation and the spread diffusion of impurities. So, it is possible to reduce the gate pitches as minimally as possible to an extent that allows arrangement of the contacts with minimum pitches.

Namely, integration of the cell transistors in the mask ROM of the present embodiment is not limited by the alignment accuracy of the ion implantation and the spread diffusion of impurities. In other words, the integration is determined by wiring pitches in the wiring process. Therefore, unlike the conventional technology, it is expected that this invention is capable of improving integration of the cell transistors more and more as the fine manufacture of the CMOS process is advanced.

An oxide film 13 is formed on the GND lines 2 and the gate electrodes 11. Herein, the oxide film is firstly formed on the GND lines and gate electrodes, then, the first-layer metals 3 are formed as upper layers on the first oxide film. Then, the oxide film is formed again on the first-layer metals 3. In addition, the second-layer metals 12 are formed on the oxide film as the bit lines. Further, the vias 4 are selectively formed to establish connections between the first-layer metals 3 and the second-layer metals 12, which require the connections.

Figure 4:
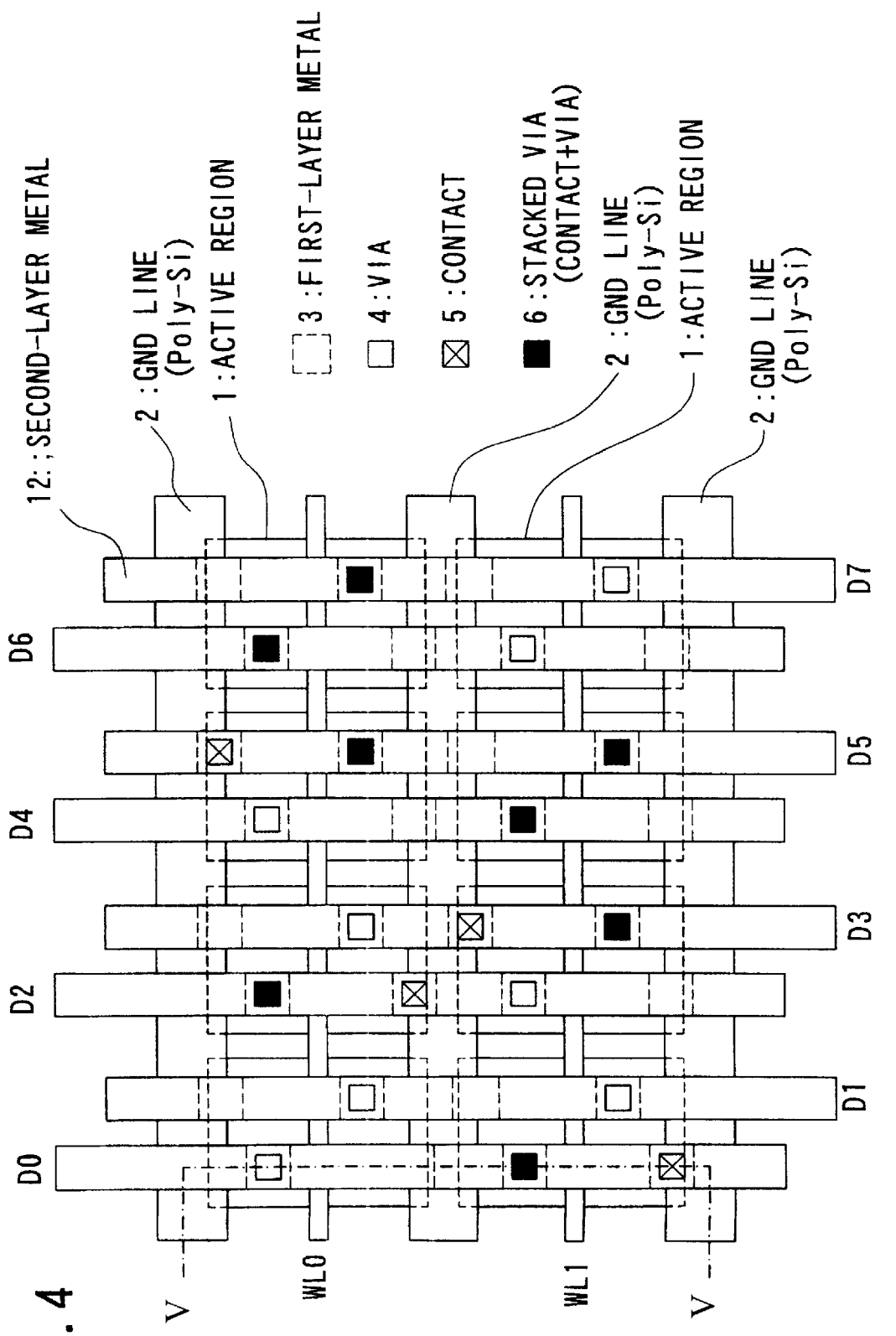
FIG. 4 is a plan view showing construction of the integrated circuit corresponding to the multivalued mask ROM, to which ROM codes are written.

FIG. 4 is a plan view of the integrated circuit corresponding to the multivalued mask ROM, to which ROM codes are written. Herein, contacts 5 and stacked vias 6 are formed at some necessary portions.

Figure 5:
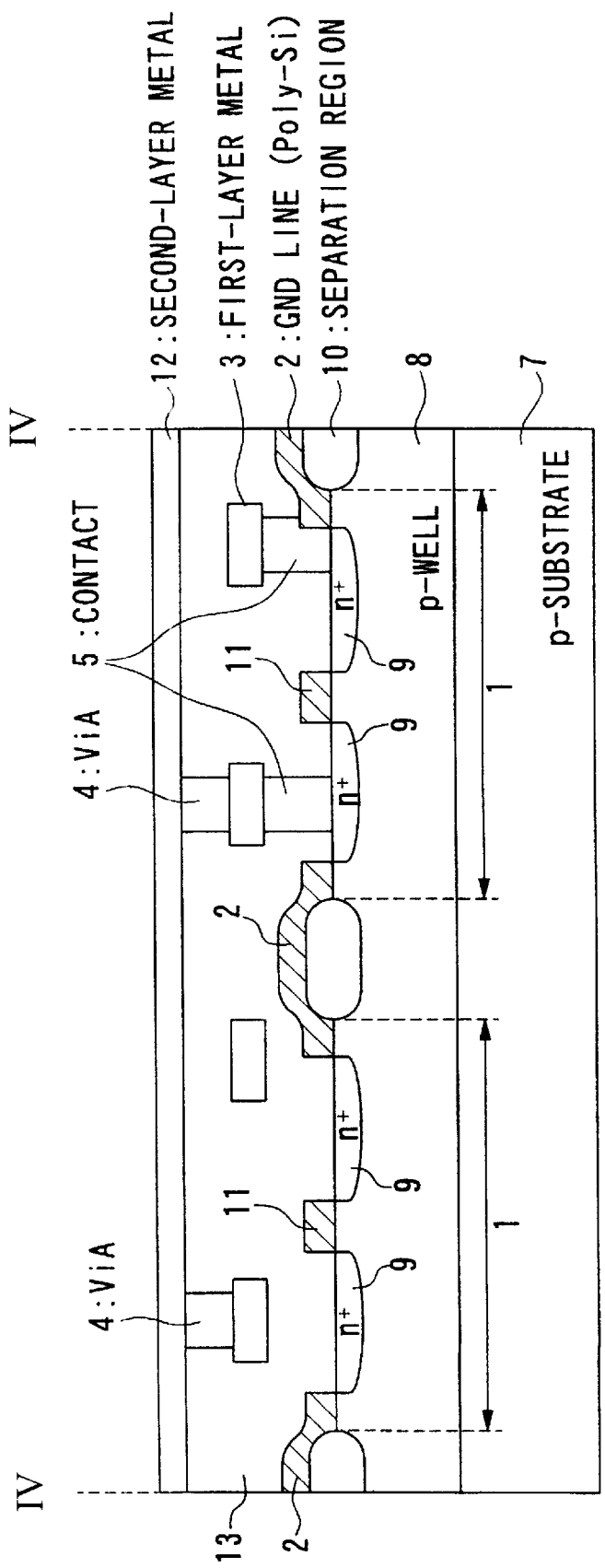
FIG. 5 is a cross sectional view taken along line IV—IV in FIG. 4.

FIG. 5 is a cross sectional view taken along line V—V in FIG. 4. Herein, a contact 5 is formed between a rightmost first-layer metal 3 and a border between the n+ region 9 and the GND line 2. This contact 5 is provided to establish connection between the n+ region 9 and the GND line 2.

In addition, another contact 5 is formed between a first-layer metal 3, which is second one from the right of FIG. 5, and its below n+ region 9. As a result, the "second" first-layer metal 3 is connected to the n+ region 9 by the contact 5. In addition, the second first-layer metal 3 is also connected to the second-layer metal 12 by the via 4. Because both of the via 4 and the contact 5 are provided in a region corresponding to the second first-layer metal 3, a mark (i.e., black square) is illustrated at a corresponding portion in FIG. 4.

Figure 6:
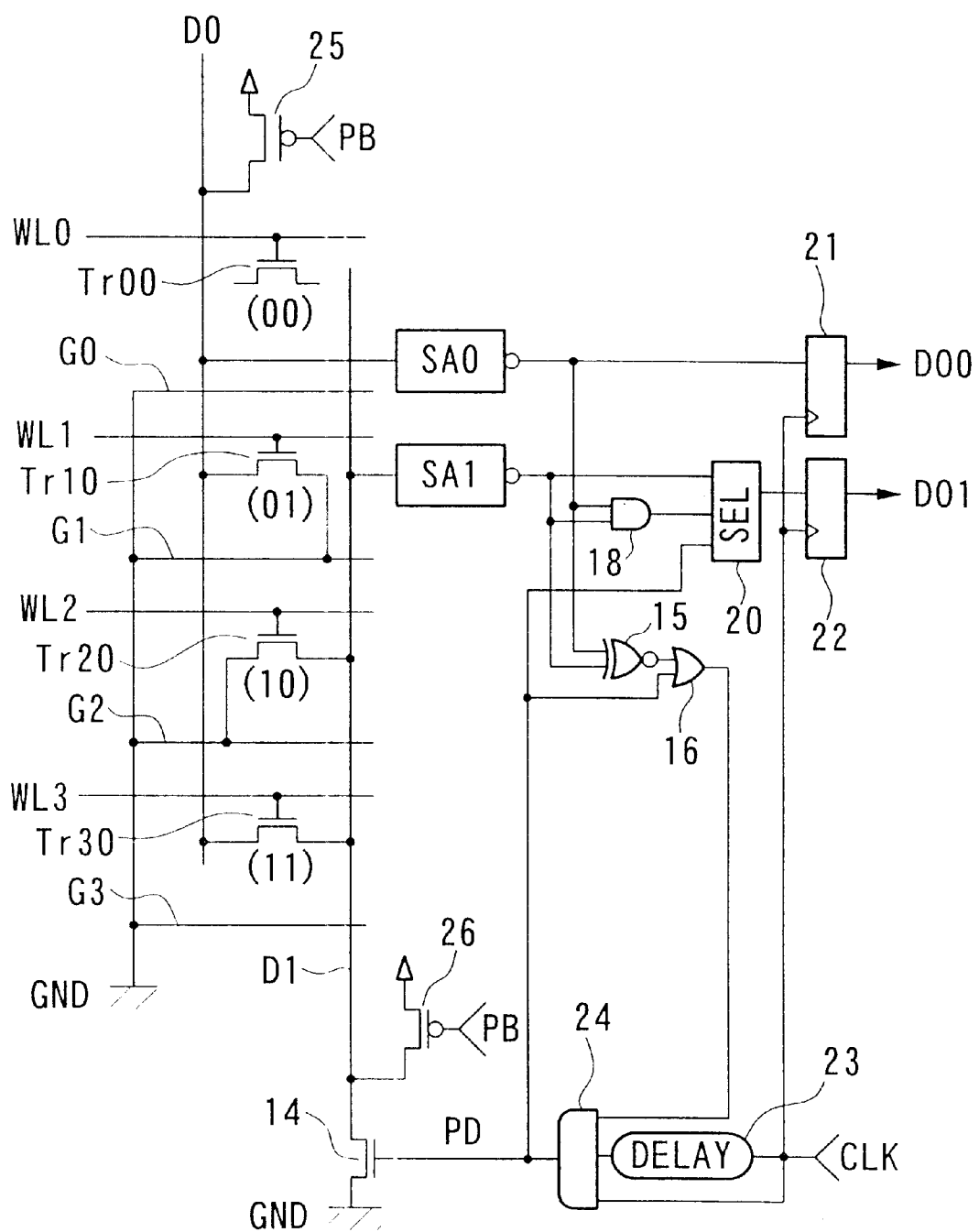
FIG. 6 is a circuit diagram showing a selected part of the multivalued mask ROM and circuitry for reading out information of cell transistors.

FIG. 6 shows a selected part of the mask ROM and circuitry for reading out information stored in the mask ROM. Specifically, FIG. 6 shows only a series of cell transistors Tr00, Tr10, Tr20, Tr30, which are arranged in a same column and which are encompassed by bit lines D0, D1. Herein, the transistors Tr00, Tr10, Tr20 and Tr30 respectively store codes (00), (01), (10) and (11). As described before, those codes are actualized by types of wiring applied to the transistors. In other words, the code (00) is actualized by wiring of the cell transistor Tr00 whose source and drain are not at all connected to any of the lines, while the code (01) is actualized by wiring of the cell transistor Tr10 whose source and drain are connected to the bit line D0 and GND line G1 respectively. In addition, the code (10) is actualized by wiring of the cell transistor Tr20 whose source and drain are connected to the GND line G2 and bit line D1 respectively, while the code (11) is actualized by wiring of the cell transistor Tr30 whose source and drain are connected to the bit lines D0 and D1 respectively.

Gates of the cell transistors Tr00, Tr10, Tr20 and Tr30 are respectively connected with the word lines WL0, WL1, WL2 and WL3.

For the purpose of precharge of the bit line D0, a drain of a transistor 25 is connected to the bit line D0. Incidentally, power source voltage (i.e., High level) is applied to a source of the transistor 25. A gate of the transistor 25 is "Low active". A precharge signal PB is input to the gate of the transistor 25.

For the purpose of precharge of the bit line D1, a drain of a transistor 26 is connected to the bit line D1. The power source voltage (i.e., High level) is applied to a source of the transistor 26. A gate of the transistor 26 is "Low active". A precharge signal PB is input to the gate of the transistor 26.

For the purpose of pull-down of the bit line D1, a drain of a transistor 14 is further connected to the bit line D1. A source of the transistor 14 is grounded. A gate of the transistor 14 is "High active". A pull-down signal PD is input to the gate of the transistor 14.

The bit lines D0, D1 are respectively connected to input terminals of sense amplifiers SA0, SA1. Both of the sense amplifiers SA0, SA1 have the same function. That is, each sense amplifier inputs a state of the bit line, wherein it inverts an input thereof in logic to provide an output. Outputs of the sense amplifiers SA0, SA1 are supplied to an exclusive-NOR gate 15. In addition, the output of the sense amplifier SA0 is supplied to a latch 21, while the output of the sense amplifier SA1 is supplied to a selector 20.

Further, the outputs of the sense amplifiers SA0, SA1 are supplied to an AND gate 18, an output of which is supplied to the selector 20. An output of the selector 20 is supplied to a latch 22. Both of the latches 21, 22 have the same function. That is, each of the latches 21, 22 operates as follows:

When a clock signal CLK being input to a clock input terminal of the latch is at a High level, the latch is placed in a through state in which an input is directly passed to an output. When the clock signal CLK is at a Low level, the latch latches an input thereof In a period of time in which the clock signal CLK remains at the Low level, the latch continuously outputs the latched input thereof Incidentally, the latch 21 outputs a latch signal DO0, while the latch 22 outputs a latch signal DO1.

As described above, the clock signal CLK is input to the clock input terminals of the latches 21, 22. In addition, the clock signal CLK is input to a delay element 23 and a three-input AND gate 24. An output of the delay element 23 is supplied to the three-input AND gate 24. An output of the three-input AND gate 24 corresponds to the pull-down signal PD, which is supplied to the gate of the transistor 14. In addition, the pull-down signal PD is also delivered to a control terminal of the selector 20 and an OR gate 16. The OR gate 16 also inputs an output of the exclusive-NOR gate 15. An output of the OR gate 16 is supplied to the three-input AND gate 24.

The selector 20 operates in accordance with an input to the control terminal, i.e., the pull-down signal PD, as follows:

When the pull-down signal PD is Low, the selector 20 selects the output of the sense amplifier SA1, which is forwarded to the latch 22. When the pull-down signal PD is High, the selector 20 selects the output of the AND gate 18, which is forwarded to the latch 22.

Next, a description will be given with respect to a method to read out 2-bit information being stored in each cell transistor by the aforementioned circuitry.

First, the transistors 25, 26 are turned ON so that the bit lines D0, D1 are subjected to precharge and are set at High levels respectively.

Next, the transistors 25, 26 are turned OFF so that the precharge is ended. Even when the transistors 25, 26 are turned OFF, there are no paths by which charges of the bit lines D0, D1 are to be released. Hence, the bit lines D0, D1 remain at the High levels. Thereafter, the word line connected to the cell transistor whose information is to be read out is activated, in other words, the word line is increased in level from Low to High. In addition, the cell transistor is turned ON. In order to read out information stored in the cell transistor Tr00 (see FIG. 6), for example, the corresponding word line WL0 is activated, and the cell transistor Tr00 is turned ON.

Then, detection is made on present states of the bit lines D0, D1. If only the bit line D0 is changed in level to Low, it can be said that a terminal of the cell transistor which is close to the bit line D1 is connected with the GND line. Hence, information stored in the cell transistor is (01). In contrast, if only the bit line D1 is changed in level to Low, it can be said that a terminal of the cell transistor which is close to the bit line D0 is connected with the GND line. Hence, information stored in the cell transistor is (10). Because of the reasons described above, there is no probability in which both of the bit lines D0, D1 are simultaneously changed in level to Low. If both of the bit lines D0, D1 are not changed in levels at all, there are established two conditions of connections for the cell transistor, i.e., a first condition in which the cell transistor is not at all connected with the bit lines D0, D1 and a second condition in which the cell transistor is connected with both of the bit lines D0, D1. That is, stored information of the cell transistor should be (00) or (11).

If both of the bit lines D0, D1 are not changed in levels at all, the transistor 14 is turned ON, so that the bit line D1 is subjected to pull-down and is decreased in level to Low. In this case, if the bit line D0 is not changed in level and remains being High, it is possible to make determination that the cell transistor is not at all connected with the bit lines D0, D1. Therefore, stored information of the cell transistor is (00). If the bit line D0 is also decreased in level to Low in connection with the pull-down of the bit line D1, it can be said that the bit lines D0, D1 are connected together by way of the cell transistor. In that case, stored information of the cell transistor should be (11).

Next, concrete operations of the aforementioned circuitry will be described in detail with reference to time charts of FIGS. 7A to 7K. In a duration (e.g., a period of time before time t0) in which a clock signal CLK (see FIG. 7A) is in a Low level, a precharge signal PB is also in a Low level. As described before, gates of the transistors 25, 26 inputting the precharge signal PB are made "Low active". So, in a duration in which the precharge signal PB is in the Low level, both of the transistors 25, 26 are ON. Thus, both of the bit lines D0, D1 which are respectively connected with the drains of the transistors 25, 26 are placed in High levels. The bit lines D0, D1 are respectively connected to the sense amplifiers SA0, SA1, wherein inputs (i.e., High-level inputs)

are inverted. Thus, (Low-level) outputs of the sense amplifiers SA0, SA1 are input to the exclusive-NOR gate 15, an output of which is turned to be High.

In duration in which the clock signal CLK is in a High level, the precharge signal PB is also placed in a High level. Therefore, the transistors 25, 26 are turned OFF, so that precharge to the bit lines D0, D1 is stopped. Thus, it is possible to start detection on data being stored in the cell transistor(s).

At time t0 when the clock signal CLK is changed in level from Low to High, the precharge signal PB is correspondingly changed in level from Low to High. Thus, the precharge to the bit lines D0, D1 is stopped.

At the same time, the word line WL0 (see FIG. 7C) is changed in level from Low to High. Thus, a High level is applied to the gate of the cell transistor Tr00, which is turned ON. Herein, the source and drain of the cell transistor Tr00 are not at all connected with the bit lines D0, D1. For this reason, the bit lines D0, D1 are not changed in potential level (or voltage). This indicates that information being stored in the cell transistor Tr00 should be (00) or (11).

Voltages (or levels) of the bit lines D0, D1 (where D0=High, D1=High) are detected by the sense amplifiers SA0, SA1 respectively. In addition, outputs of the sense amplifiers SA0, SA1 (where SA0=Low, SA1=Low) are input to the latch 21 and the selector 20 respectively. At time t0, the clock signal CLK input to the clock input terminal of the latch 21 is increased in level to High, so that the latch 21 is placed in a through state. In that state, the latch 21 directly outputs an input thereof, which corresponds to the (Low-level) output of the sense amplifier SA0. Therefore, the latch 21 outputs a latch signal DO0 (see FIG. 7H), which is Low.

The (Low-level) output of the sense amplifier SA1 is input to the selector 20. At time t0, the control terminal of the selector 20 is supplied with a pull-down signal PD (see FIG. 7G), which is Low. Thus, the selector 20 selects the (Low-level) output of the sense amplifier SA1, which is forwarded to the latch 22. Like the aforementioned latch 21, the latch 22 is also placed in a through state. As a result, the latch 22 outputs a latch signal DO0 (see FIG. 7K), which is Low in response to the Low-level output of the sense amplifier SA1.

The outputs of the sense amplifiers SA0, SA1 (where SAO=Low, SA1=Low) are also input to the exclusive-NOR gate 15, an output of which remains at a High level. Such an output of the exclusive-NOR gate 15 is input to the OR gate 16. So, an output of the OR gate 16 should be at a High level.

The output of the OR gate 16 is input to the three-input AND gate 24. The three-input AND gates also inputs the clock signal CLK and a delayed signal, which is produced by the delay element 23 delaying the clock signal CLK. The clock signal CLK is changed in level from Low to High at time t0. However, an output of the delay element 23 is delayed from the clock signal CLK. Therefore, the output of the delay element 23 is changed in level from Low to High at time t1, which is delayed from the time t0 by a delay time Td being set to the delay element 23.

As described above, the output of the delay element 23 is input to the three-input AND gate 24. Hence, all the three inputs of the AND gates 24 are placed at High levels respectively at the time t1 at which the output of the delay element 23 is changed in level to High. Therefore, an output of the three-input AND gate 24 corresponds to a pull-down signal (see FIG. 7G), which is changed in level from Low to High at the time t1.

The pull-down signal PD is input to the gate of the transistor 14. So, the transistor 14 is turned ON at the time t1. When the transistor 14 is turned ON, the bit line D1 connected with the drain of the transistor 14 is subjected to pull-down and is decreased in level to Low (see FIG. 7I). State of the bit line D1 is detected by the sense amplifier SA1. Therefore, an output of the sense amplifier SA1 is changed in level from Low to High.

At time t1, the word line WL0 is activated (see FIG. 7C) to select the cell transistor Tr00. As described before, the source and drain of the cell transistor Tr00 are not at all connected with any of the lines. For this reason, the bit line D0 is not influenced at all even if the bit line D1 is subjected to pull-down and is decreased in level to Low. Hence, the bit line D0 remains at the High level. At this time, it is possible to determine that stored information of the cell transistor Tr00 should be (00).

It is described before that the bit line D0 is at the High level while the bit line D1 is at the Low level at the time t1 when the bit line D1 is subjected to pull-down, so an output of the sense amplifier SA0 is Low while an output of the sense amplifier SA1 is High. Such Low-level output of the sense amplifier SA0 is input to the latch 21. At time t1, the latch is placed in a through state because the clock signal CLK is High. Therefore, the latch 21 directly outputs the input thereof. That is, an output of the latch 21 corresponds to a latch signal DO0, which is retained in a Low level.

An output of the sense amplifier SA1 is input to the selector 20. At time t1, the pull-down signal PD input to the control terminal of the selector 20 becomes High. For this reason, the selector 20 does not select the output of the sense amplifier SA1 but selects an output of the AND gate 18. The output of the AND gate 18 is Low because the output of the sense amplifier SA0 is Low while the output of the sense amplifier SA1 is High. Such Low-level output of the AND gate 18 is selected by the selector 20 and is forwarded to the latch 22. At time t1, the latch 22 is also placed in the through state. Therefore, the latch 22 directly outputs the input thereof. That is, the latch 22 outputs a latch signal D0, which is retained at a Low level.

Figure 7:
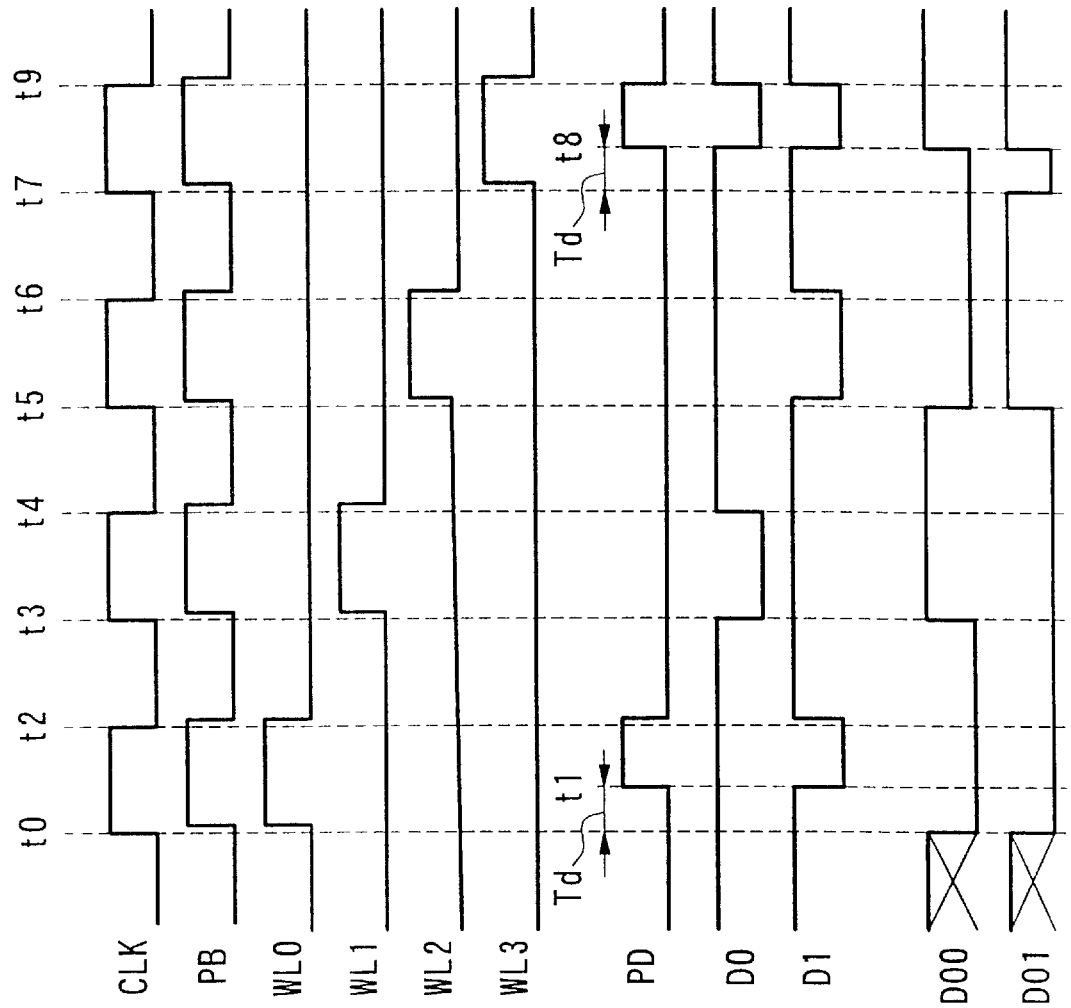
FIG. 7A is a time chart showing a clock signal CLK.
FIG. 7B is a time chart showing a precharge signal PB.
FIG. 7C is a time chart showing level variations of a word line WL0.
FIG. 7D is a time chart showing level variations of a word line WL1.
FIG. 7E is a time chart showing level variations of a word line WL2.
FIG. 7F is a time chart showing level variations of a word line WL3.
FIG. 7G is a time chart showing a pull-down signal PD.
FIG. 7H is a time chart showing level variations of a bit line D0.
FIG. 7I is a time chart showing level variations of a bit line D1.
FIG. 7J is a time chart showing a latch signal DO0.
FIG. 7K is a time chart showing a latch signal DO1.

At time t2 when the clock signal CLK is decreased in level to Low, the three-input AND gate 24 inputting the clock signal CLK outputs the pull-down signal PD, which is correspondingly decreased in level to Low (see FIG. 7G). Thus, the transistor 14 is turned OFF, so that the pull-down to the bit line D1 is stopped.

In synchronization with the clock signal CLK which becomes Low, the precharge signal PB correspondingly becomes Low (see FIGS. 7A, 7B). So, the transistors 25, 26 both of which input the precharge signal PB are simultaneously turned ON. Thus, precharge to the bit lines D0, D1 is started by way of the transistors 25, 26.

At time t2 when the clock signal CLK becomes Low, both of the latches 21, 22 whose clock input terminals input the clock signal CLK are simultaneously placed in latch states. Therefore, in a duration between times t2 and t3 in which the clock signal CLK remains Low, outputs of the latches 21, 22 are not changed at all even if inputs thereof are changed.

At time t3 when the clock signal CLK becomes High, the precharge signal PB correspondingly becomes High (see FIGS. 7A, 7B). So, precharge to the bit lines D0, D1 is stopped. In addition, the word line WL1 is activated (see FIG. 7D), so that the cell transistor Tr10 is turned ON. As for the cell transistor Tr10, one terminal is connected to the bit line D0, while another terminal is connected to the GND line G1. Since the cell transistor Tr10 is turned ON, the bit line D0 is connected with the GND line G1 by way of the transistor Tr10. So, the bit line D0 is decreased in level to Low (see FIG. 7H).

At this time, no terminal of the cell transistor Tr10 is connected with the bit line D1. So, the bit line D1 is not changed in level and remains at the High level. That is, there is established a condition where D0=Low and D1=High. Thus, it is possible to determine that stored information of the cell transistor Tr10 should be (01).

When the delay time of the delay element 23 elapses from the time t3, the output of the delay element 23 is increased in level to High.

In this case, however, the output of the sense amplifier SA0 is High while the output of the sense amplifier SA1 is Low because of the aforementioned condition where D0=Low, D1=High. Those outputs of the sense amplifiers SA0, SA1 are input to the exclusive-NOR gate 15, an output of which is Low. Such a Low-level output of the exclusive-NOR gate 15 is supplied to a first input of the OR gate 16, whose second input receives the pull-down signal PD. At this time, the pull-down signal PD is at the Low level. That is, both of the inputs of the OR gate 16 are Low. As a result, an output of the OR gate 16 is Low. Such a Low-level output of the OR gate 16 is input to the three-input AND gate 24. Therefore, the three-input AND gate 24 outputs the pull-down signal PD, which remains at the Low level. In this case, the bit line D1 is not subjected to pull-down. The aforementioned High-level output of the sense amplifier SA0 is provided as the latch signal DO0 (High, see FIG. 7J) by means of the latch 21. In addition, the pull-down signal PD remains at the Low level (see FIG. 7G), so the selector 20 whose control terminal inputs the pull-down signal PD is retained in the state to select the (Low-level) output of the sense amplifier SA1. Further, the output of the selector 20 is provided as the latch signal DO1 by way of the latch 22. So, the latch signal DO1 remains at the Low level (see FIG. 7K).

At time t4, the clock signal CLK is changed in level to Low, so the latches 21, 22 are placed in the latch states respectively. Thereafter, the latch signal DO0, DO1 are not changed in level at all until time t5 when the clock signal CLK is changed in level to High. Therefore, precharge to the bit line is started at the timing which is slightly delayed from the time t4, so that the bit line D0 is changed in level from Low to High (see FIG. 7H). In response to such level change of the bit line D0, the output of the sense amplifier SA0, which is an input to the latch 21, is changed in level from High to Low. However, the output of the latch 21, which corresponds to the latch signal DO0 (see FIG. 7J), is not changed in level.

In duration of times t5–t6 which follows duration of the precharge between times t4 and t5, the word line WL2 is activated (see FIG. 7E), so that the cell transistor Tr20 is turned ON. As described before, the cell transistor Tr20 is connected with the GND line G2 and the bit line D1 respectively. When the word line WL2 is activated so that the cell transistor Tr20 is turned ON, the bit line D1 is decreased in level to Low (see FIG. 7I). However, the cell transistor Tr20 is not connected with the bit line D0. So, the bit line D0 is not changed in level and remains at the High level (see FIG. 7H). That is, there is established a condition where D0=High and D1=Low. Thus, it is possible to determine that stored information of the cell transistor Tr20 is (10).

Incidentally, the pull-down signal PD is not increased in level to High even when the delay time Td elapses from the time t5. This is because of the same operations that the circuitry performs in the foregoing duration of times t3–t4.

As compared with the foregoing duration of times t3–t4, relationship between systems SA0 and SA1 is inverted in the duration of times t5–t6. However, the circuitry repeats the same operations of the duration of times t3–t4 with respect to the sense amplifiers SA0, SA1, selector 20 and latches 21, 22 in the duration of times t5–t6. In addition, the latches 21, 22 are placed in the latch states while the bit lines D0, D1 are subjected to precharge in duration of times t6–t7. However, the circuitry repeats the same operations of the duration of times t5–t6 in the duration of times t6–t7.

In duration of times t7–t9 which follows the aforementioned duration of times t6–67 for the precharge, the word line WL3 is activated (see FIG. 7F), so that the cell transistor Tr30 is turned ON. As described before, the cell transistor Tr30 is connected with the bit lines D0 and D1. Therefore, even if the word line WL3 is activated so that the cell transistor Tr30 is turned ON, the bit lines D0, D1 are not changed in levels and remain at High levels for a while. In this case, it is possible to determine that stored information of the cell transistor Tr30 is (00) or (11).

In the above duration, the bit lines D0, D1 hold same potential levels in the foregoing duration of times t0–t1. Due to the same operations in the duration of times t0–t1, both of the latch signals DO0, DO1 are Low (see FIGS. 7J, 7K).

At time t8 when the delay time Td elapses from the time t7, the circuitry repeats the same operations at the foregoing time t1. That is, the pull-down signal PD becomes High, while the bit line D1 is subjected to pull-down by way of the transistor 14 and becomes Low. In this case, the bit lines D0 and D1 are connected together by way of the cell transistor Tr30. So, the bit line D0 is correspondingly decreased in level to Low in synchronization with the pull-down to the bit line D1. Thus, it is possible to determine that stored information of the cell transistor Tr30 is (11).

In duration of times t8–t9, the circuitry repeats basically the same operations at the foregoing duration of times t1–t2. Different from the duration of times t1–t2, both of the bit lines D0, D1 are Low in the duration of times t8–t9. So, both of the outputs of the sense amplifiers SA0, SA1 are High. That is, the output of the latch 21 (i.e., latch signal DO0, see FIG. 7J), which inputs the output of the sense amplifier SA0, becomes High at time t8.

The aforementioned High-level outputs of the sense amplifiers SA0, SA1 are input to the AND gate 18, an output of which is High. Such a High-level output of the AND gate 18 is selected by the selector 20 and is forwarded to the latch 22. Thus, the latch signal DO1 corresponding to the output of the latch 22 becomes High at time t8 (see FIG. 7K).

At time t9 when the clock signal CLK becomes Low, the latches 21, 22 are placed in latch states respectively. That is, outputs of the latches 21, 22 are fixed at time t9, which is similar to the foregoing times t2, t4 and t6.

As described above, the circuitry performs the aforementioned operations to read out a 2-bit code being stored in a "target" cell transistor, which is a target for reading information, as follows:

In synchronization with a level increase of the clock signal CLK which is to be placed in High-level duration, the word line connected with the target cell transistor is activated. Then, in Low-level duration of the clock signal CLK which emerges after the High-level duration, the circuitry reads out data latched in the latches 21, 22, i.e., latch signals DO0, D1. Thus, it is possible to read out the 2-bit code from the target cell transistor.

[B] Embodiment 2

Figure 8:
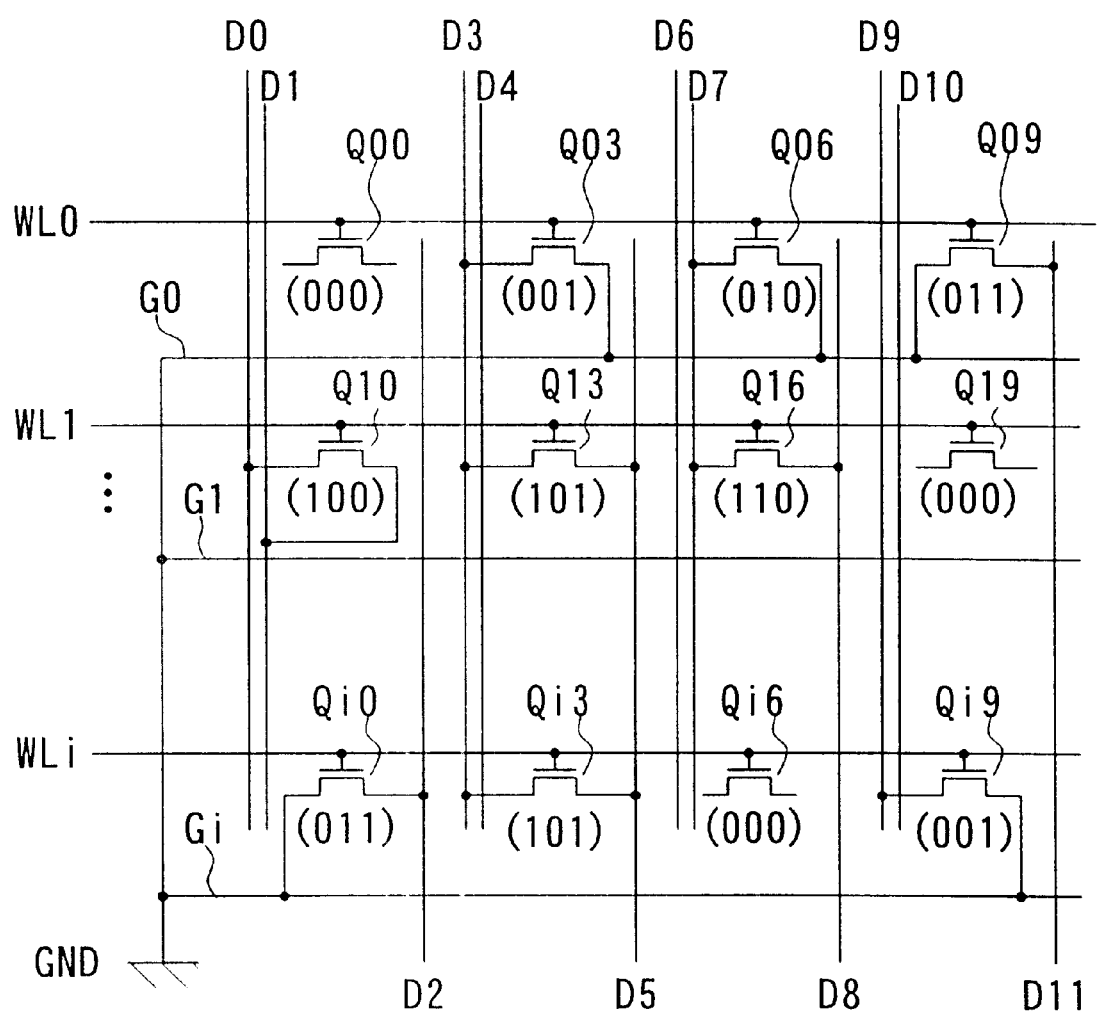
FIG. 8 is a circuit diagram showing a configuration of a multivalued mask ROM in accordance with embodiment 2 of the invention.
Figure 9:
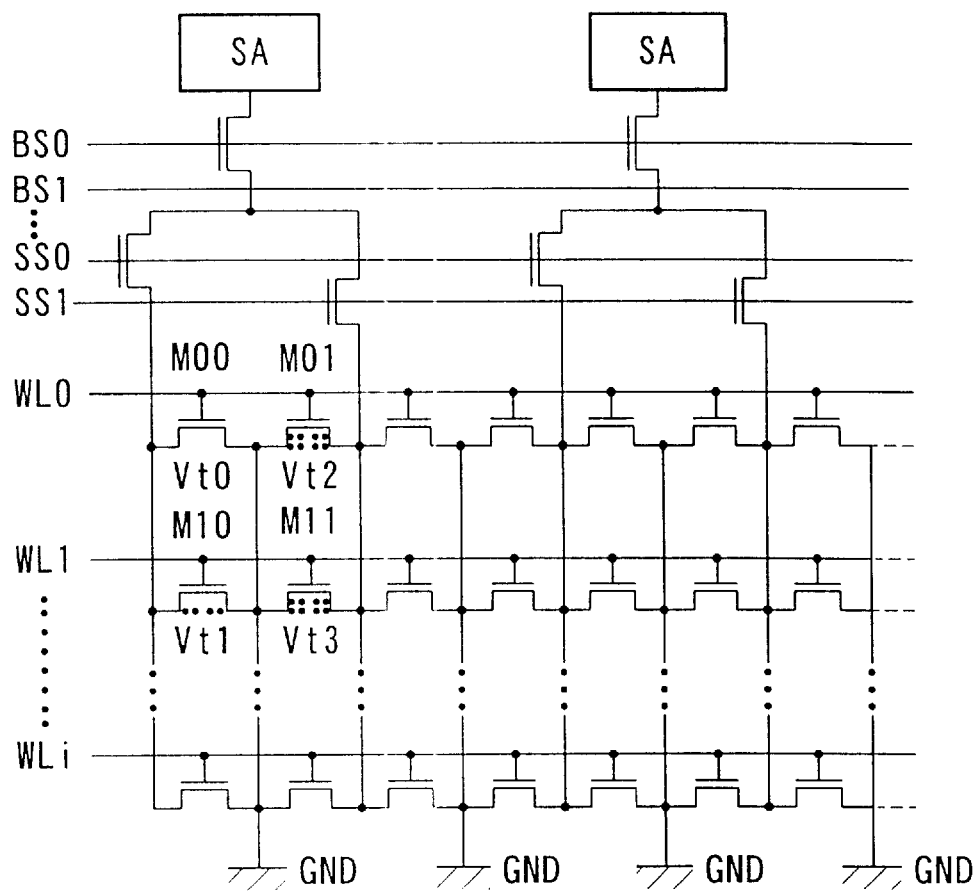
FIG. 9 is a circuit diagram showing an example of a cell array of a multivalued mask ROM.
Figure 10:
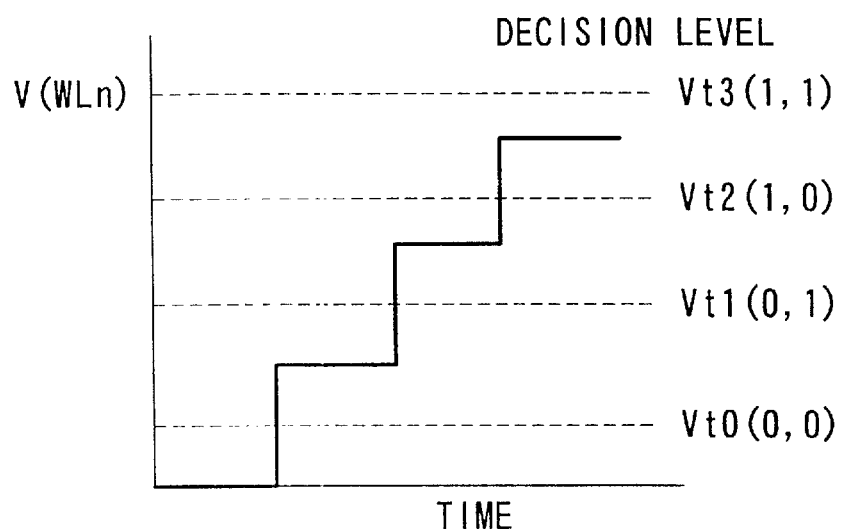
FIG. 10 is a graph showing three-step potential control on a word line in the multivalued mask ROM of FIG. 9.

FIG. 8 is a circuit diagram showing a configuration of a multivalued mask ROM in accordance with embodiment 2 of the invention. The embodiment 2 is characterized by that 3-bit information is stored in a single cell transistor. For this reason, three bit lines and one GND line are wired to encompass each cell transistor. For example, bit lines D0, D1, D2 and a GNG line G0 are wired to encompass a cell transistor Q00. That is, four lines are wired in total and are adequately connected with source and drain of the cell transistor. Thus, it is possible to store 3-bit information in accordance with conditions of connections by which the source and drain of the cell transistor are connected with the four lines.

Incidentally, this invention employs a concept of "multi-valued" for storage of information in memories. Such a concept is applicable to logic circuits other than memories. Therefore, the concept can be applied to logic circuits of master-slice types or else.

[C] Embodiment 3

Figure 11:
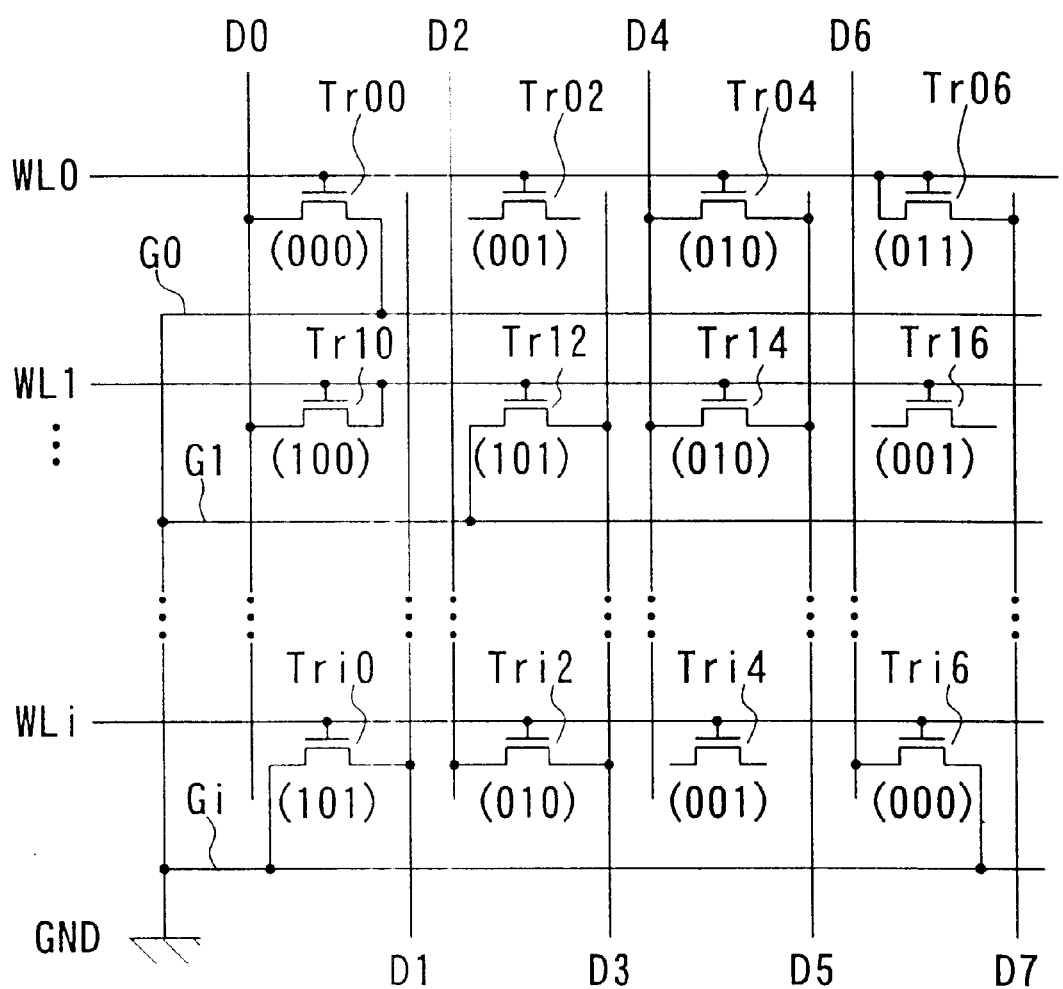
FIG. 11 is a circuit diagram showing a configuration of a multivalued mask ROM in accordance with embodiment 3 of the invention.

FIG. 11 is a circuit diagram showing a configuration of a multivalued mask ROM in accordance with embodiment 3 of the invention. FIG. 11 shows a number of cell transistors Tr00, Tr02, Tr04, Tr06 . . . , Tr10, Tri2, Tri4, Tri6. Herein, two bit lines and one GND line are wired to encompass each cell transistor. In FIG. 11, bit lines D0 to D7 are wired in vertical directions, while GND lines G0 to Gi are wired in horizontal directions.

For example, two bit lines D0, D1 and GND line G0 are wired to encompass the cell transistor Tr00. In addition, two bit lines D2, D3 and GND line G1 are wired to encompass the cell transistor Tr12. Incidentally, all the GND lines G0, G1, . . . , Gi are connected together to have GND potential.

Further, word lines WL0 to WLi are respectively wired in proximity to the cell transistors. Those word lines are wired in horizontal directions. Herein, each word line is connected with gates of cell transistors, which are horizontally aligned. For example, the word line WL0 is connected with gates of the cell transistors Tr00, Tr02, Tr04, Tr06, while the word line WL1 is connected with gates of the cell transistors Tr10, Tr12, Tr14, Tr16.

Different from the conventional art in which storing information is subjected to coding by changing thresholds of cell transistors, the multivalued mask ROM of the present embodiment is characterized by that storing information is subjected to coding in accordance with conditions of connections by which the source and drain of each cell transistor are connected with two bit lines, word line and GND line. For this reason, a single value is set for thresholds of all the cell transistors in the multivalued mask ROM. In addition, only two levels (i.e., High level and Low level) are used for voltage being applied to the gate of the cell transistor to read out a code from the cell transistor in the multivalued mask ROM.

In the multivalued mask ROM, there are established a number of combinations of connections by which two terminals (e.g., source and drain) of the cell transistor are adequately connected with four lines (i.e., two bit lines, word line and GND line). Those combinations of connections are respectively related with six states (000), (001), (010), (011), (100), (101) in which each cell transistor is placed. Relationships between the six states and the connections between the terminals of the cell transistor and lines are summarized as follows:

(000), (101): One of the source and drain is connected with one bit line, while the other is connected with the GND line.

(001): None of the source and drain is connected with any of the lines.

(010): The source and drain are respectively connected with the adjacent bit lines.

(011), (100): One of the source and drain is connected with one bit line, while the other is connected with the word line.

Therefore, revision of ROM codes can be accomplished by changing connections between the terminals of the cell transistor and its surrounding lines. In other words, it is possible to change the ROM codes by changing the wiring process.

As described before, the present embodiment needs only two levels (i.e., High level and Low level) as voltage being applied to the gate of the cell transistor. Therefore, only two levels are required as voltage being applied to the word line.

Figure 12:
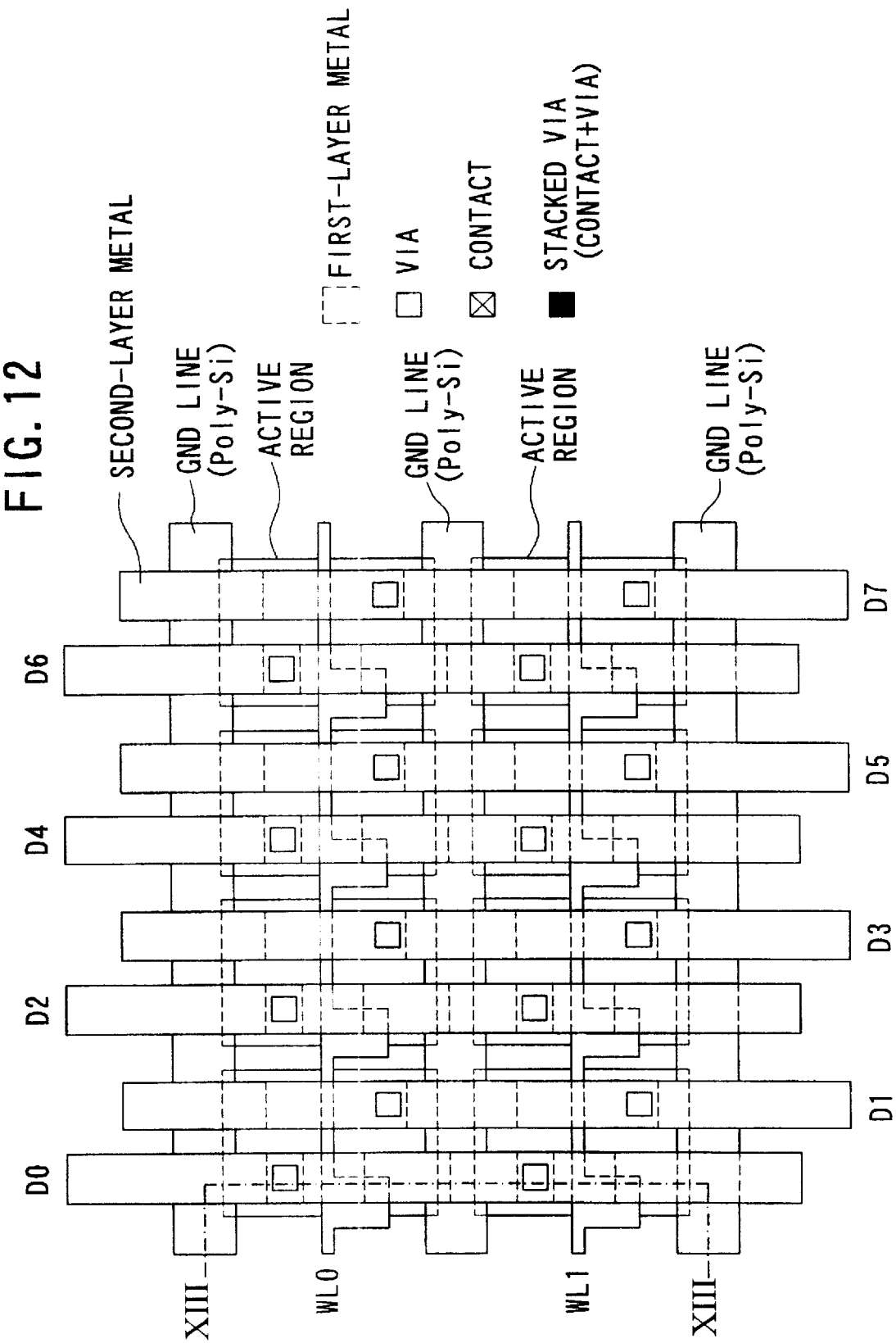
FIG. 12 is a plan view showing construction of the multivalued mask ROM of FIG. 11 in an initial condition.

FIG. 12 is a plan view showing a configuration of the multivalued mask ROM of the embodiment 3 in an integrated circuit. Actually, FIG. 12 shows an initial condition of the multivalued mask ROM in which ROM codes are not at all formed. In other words, no connections are established for sources and drains of all the cell transistors in FIG. 12.

Active regions are regions in which the cell transistors are formed. GND lines are made by poly-silicon and are wired horizontally in upper and lower portions adjoining the active region. In addition, the word lines WL0, WL1 are made of poly-silicon and are wired horizontally to traverse centers of the active regions respectively.

Each of regions surrounded by dotted lines shows first-layer metal. Vias are provided in some of the regions of the first-layer metal. The aforementioned bit lines D0 to D7 are formed as regions of second-layer metal. As described before, FIG. 12 shows the initial condition of the multivalued mask ROM in which ROM codes are not formed at all. So, none of contacts and stacked vias are formed in the multivalued mask ROM of FIG. 12. Incidentally, the stacked via is a region in which both of the contact and via are formed.

Figure 13:
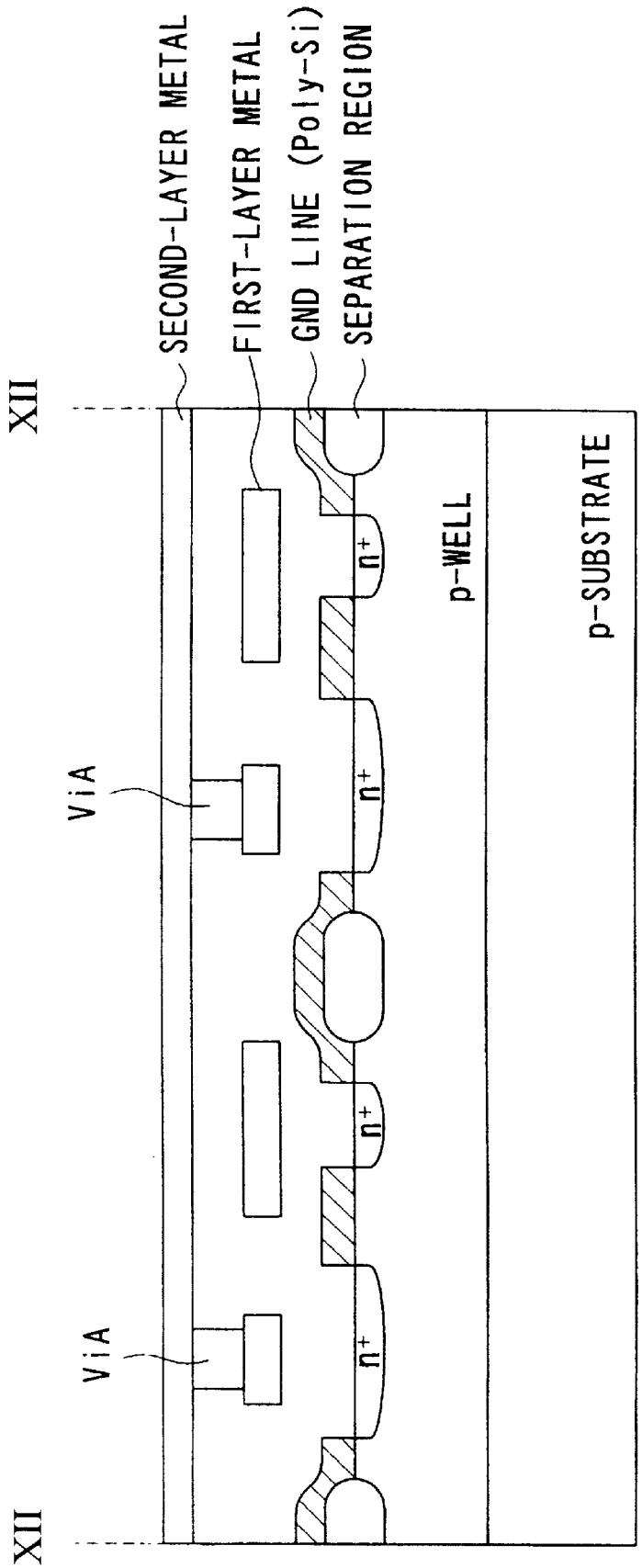
FIG. 13 is a cross sectional view taken along line XIII—XIII in FIG. 12.

FIG. 13 is a cross sectional view taken along line XIII—XIII in FIG. 12. Herein, p-well is formed as an upper layer on p-substrate. In addition, n+ regions are formed at some portions in proximity to an upper surface of the p-well. Herein, the active region contains two n+ regions, which correspond to a source region and a drain region respectively.

As described before, only a single value is required for thresholds of all the cell transistors in the multivalued mask ROM of the present embodiment. So, it is unnecessary to perform ion implantation, which is conventionally required to change the threshold of each cell transistor. For this reason, it is unnecessary to prepare a mask being used for the above ion implantation. Incidentally, a separation region is formed between two active regions which adjoin each other.

GND lines are made by poly-silicon and are formed as upper layers on the separation regions. In addition, gate electrodes are made by poly-silicon and are formed at selected portions, each of which is sandwiched between the source region and drain region, on the upper surface of the p-well. The gate electrodes coincide with the aforementioned word lines. Herein, each cell transistor has a projection portion which enables connections between the gate electrode, source and drain by a common contact in the present embodiment.

As described before, the present embodiment needs a single value for the thresholds of the cell transistors in the multivalued mask ROM. Hence, it is unnecessary to perform ion implantation, which is conventionally required to change the threshold with respect to each cell transistor. Therefore, it is unnecessary to make consideration on the alignment accuracy of the ion implantation and the spread diffusion of impurities. Thus, it is possible to reduce gate pitches as minimally as possible to an extent that allows arrangement of contacts with minimum pitches.

Because of the reasons described above, in the present embodiment, integration of the cell transistors of the multivalued mask ROM is not limited by the alignment accuracy and spread diffusion of impurities. In other words, the integration of the cell transistors is determined by wiring pitches in the wiring process. Therefore, different from the conventional memories, it is possible to improve the integration of the cell transistors as the fine manufacture of the CMOS process is developed.

An insulation film is formed on the GND lines and gate electrodes. The aforementioned regions of first-layer metal are formed on the insulation film. Then, an insulation film is further formed on the first-layer metal. Thereafter, the second-layer metal is formed on the insulation film to form the bit line. The vias are formed to establish connections between the second-layer metal and the regions of the first-layer metal, which should be connected together.

Figure 14A:
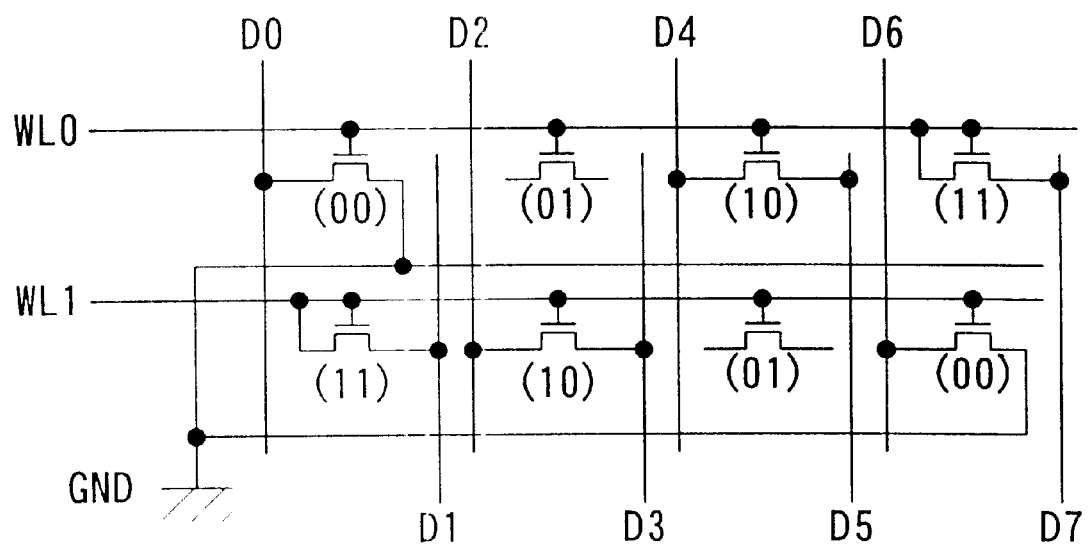
FIG. 14A is a circuit diagram showing a part of an integrated circuit corresponding to the multivalued mask ROM in which ROM codes are written.

FIG. 14A is a circuit diagram showing a selected part of an integrated circuit corresponding to the multivalued mask ROM in which ROM codes are written. FIG. 14B is a plan view showing construction of the integrated circuit of FIG. 14A. Herein, contacts and stacked vias are formed at selected portions of the integrated circuit.

Figure 15:
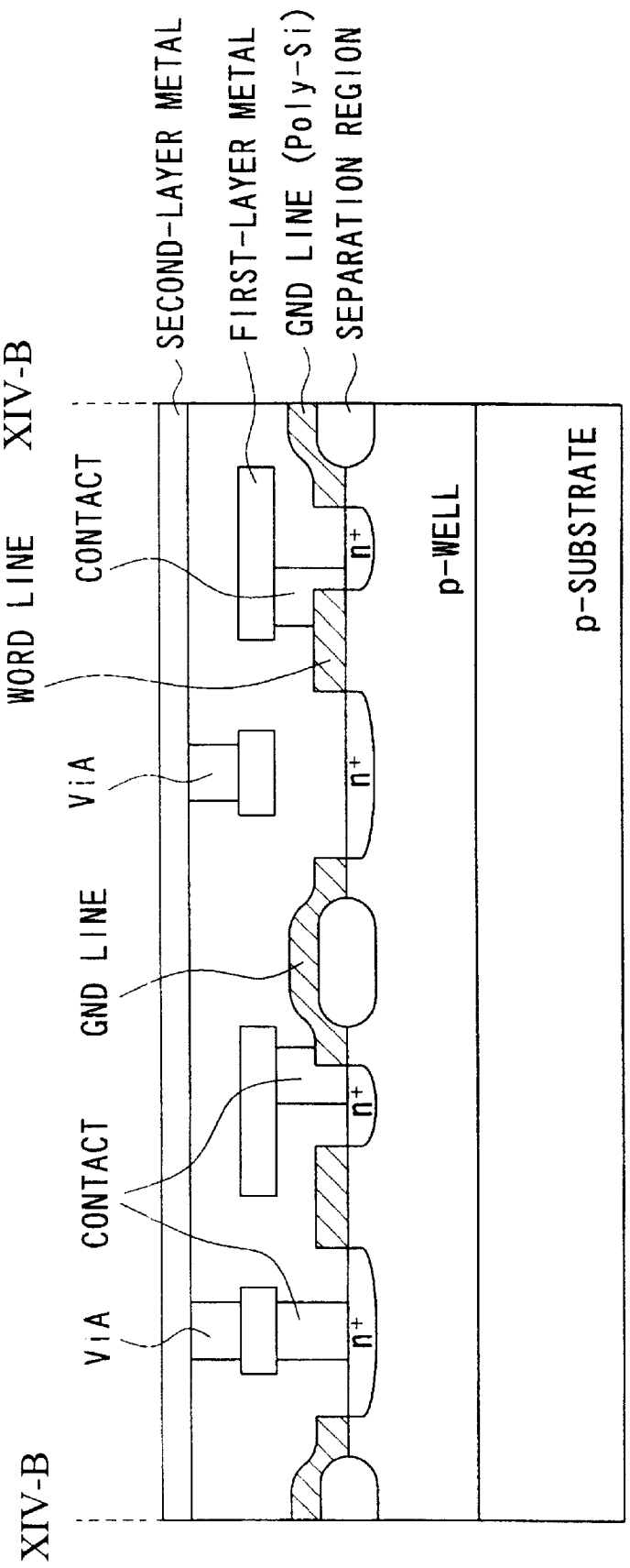
FIG. 15 is a cross sectional view taken along line XV—XV in FIG. 14B.

FIG. 15 is a cross sectional view taken along line XV—XV in FIG. 14B. Herein, a contact is formed between a rightmost region of first-layer metal and a border portion between an n+ region and a word line. This contacts connects the n+ region and word line together. Similarly, a contact is formed between a second region of first-layer metal, being observed from the left of FIG. 15, and a border portion between an n+ region and a GND line. This contacts connects the n+ region and GND line together.

In addition, a contact is formed between a leftmost region of first-layer metal and an n+ region. As a result, the leftmost region of first-layer metal is connected with its corresponding n+ region by means of the contact. The leftmost region of first-layer metal is also connected with second-layer metal by means of a via. That is, both of the contact and via are formed with respect to an area corresponding to the leftmost region of first-layer metal. For this reason, a mark (i.e., black square) of a stacked via is illustrated at a position, corresponding to the above area, in FIG. 14B.

Figure 16:
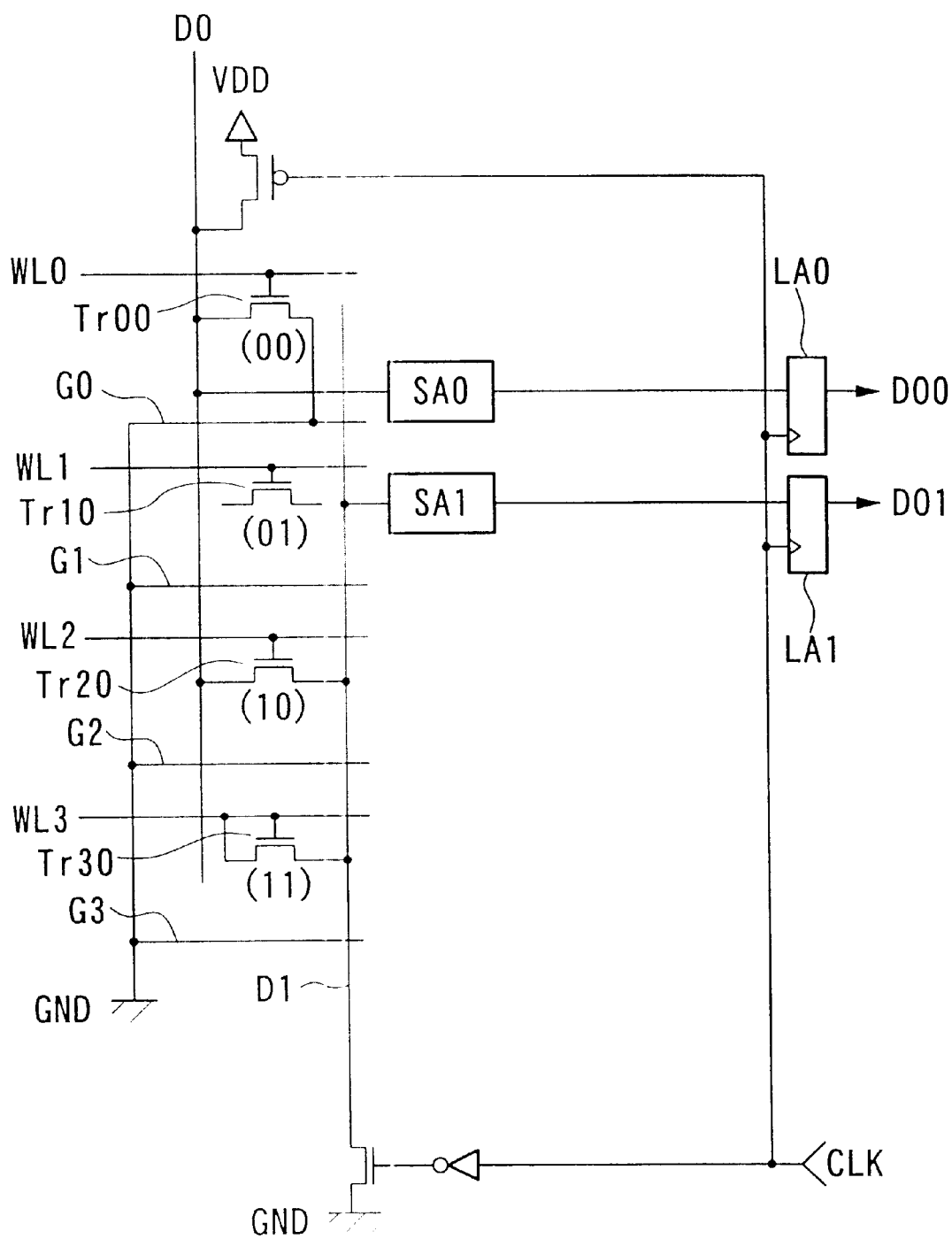
FIG. 16 is a circuit diagram showing a selected part of the multivalued mask ROM and its circuitry for reading out information from cell transistors.

Next, operations of the embodiment 3 will be described in detail with reference to FIG. 16 and time charts of FIGS. 17A to 17I. Herein, FIG. 16 shows a selected part of the multivalued mask ROM and its circuitry for reading out information from each cell transistor. Specifically, FIG. 16 shows only a part of a four-valued mask ROM containing a series of cell transistors Tr00, Tr10, Tr20 and Tr30, which are disposed in column and which are encompassed by bit lines D0, D1, word lines WL0–WL3 and GND lines G0–G3. The word lines WL0, WL1, WL2 and WL3 are respectively connected with gates of the cell transistors Tr00, Tr10, Tr20 and Tr30.

The aforementioned four-valued mask ROM is designed such that the cell transistors Tr00, Tr10, Tr20 and Tr30 store four-valued codes of (00), (01), (10) and (11) respectively. Information being stored in each cell transistor is translated by connections of lines being adequately connected with two terminals of each cell transistor. Namely, two terminals (e.g., source and drain) of the cell transistor Tr00 are respectively connected with the bit line D0 and GND line G0. None of source and drain of the cell transistor Tr10 is connected with any of the lines. Two terminals of the cell transistor Tr20 are respectively connected with the bit lines D0, D1. Two terminals of the cell transistor Tr30 are respectively connected with the word line WL3 and bit line D1.

The bit line D0 is connected with a drain of a PMOS (or P-channel MOS) transistor, which is provided to perform precharge to the bit line D0. A source of the PMOS transistor is connected to a power source having a High level. A gate of the PMOS transistor is "Low active". A clock signal CLK is supplied to the gate of the PMOS transistor as a precharge signal.

In addition, the bit line D1 is connected to a drain of an NMOS (or N-channel MOS) transistor, which is provided to effect pull-down to the bit line D1. A source of the NMOS transistor is grounded. A gate of the NMOS transistor is "High active". An inverted signal of the clock signal CLK is supplied to the gate of the NMOS transistor as a pull-down signal.

The bit lines D0, D1 are respectively connected to input terminals of sense amplifiers SA0, SA1. Each of the sense amplifier SA0, SA1 directly outputs an input thereof, which corresponds to a state (or logic) of the bit line being connected thereto. Herein, the sense amplifier SA0 has a logic decision level (see FIG. 17F), which is higher than a half level (i.e., (VDD+ GND)/2) calculated between a High level (VDD) and a Low level (GND). In addition, the sense amplifier SA1 has a logic decision level (see FIG. 17G), which is lower than the aforementioned half level between the High level and Low level.

Outputs of the sense amplifiers SA0, SA1 are respectively supplied to latches LA0, LA1. Both of the latches LA0, LA1 have the same function. Namely, when the clock signal CLK being input to a clock input terminal becomes High, the latch is placed in a through state to directly pass an input thereof to an output thereof. When the clock signal CLK becomes Low, the latch is placed in a latch state to latch an input thereof for a while. That is, the latch continuously outputs the latched input thereof during a period of time in which the clock signal CLK is in a Low level. Incidentally, the latches LA0, LA1 respectively output latch signals DO0, DO1.

As described above, the clock signal CLK is supplied to the clock input terminals of the latches LA0, LA1. In addition, the clock signal CLK is also delivered to a gate of the PMOS transistor, used for precharge to the bit line D0, as well as an inverter producing the pull-down signal, by which the bit line D1 is subjected to pull-down.

Next, a description will be given with respect to a method to read out 2-bit information being stored in each cell transistor. First, the clock signal CLK is placed in a Low level so that both of the PMOS transistor and NMOS transistor, which are respectively connected with the bit lines D0, D1, are turned ON. This initiates precharge to the bit line D0, by which the bit line D0 is placed at a High level. In addition, the bit line D1 is subjected to pull-down, by which the bit line D1 is placed at a Low level.

Next, the clock signal CLK is increased to a High level so that both of the PMOS transistor and NMOS transistor, respectively connected with the bit lines D0, D1, are turned OFF. This ends the precharge to the bit line D0 and pull-down to the bit line D1. At this time, there exists no path for releasing charges of the bit line D0, and there exists no path for applying charges to the bit line D1 even when the PMOS transistor and NMOS transistor are turned OFF. Hence, the bit line D0 remains at the High level, while the bit line D1 remains at the Low level. Thereafter, a specific word line, connected with a gate of a "target" cell transistor which is a target for reading out information, is activated, in other words, it is changed in level from Low to High, so that the target cell transistor is to be turned ON. In order to read out information being stored in the cell transistor Tr00, for example, its corresponding word line WL0 is activated so that the cell transistor Tr00 is turned ON.

Then, states (or levels) of the bit lines D0, D1 are subjected to decisions by the sense amplifiers SA0, SA1 respectively. In the case of the four-valued mask ROM of FIG. 16, it is possible to discriminate four states based on potential variations of the bit lines D0, D1 after activation of the word line.

For example, if a level change occurs only on the bit line D0 whose level is changed from High to Low while the bit line D1 remains at Low, it can be said that a terminal of the cell transistor which is close to the bit line D1 is connected to the GND line. Hence, it is possible to determine that stored information of the cell transistor is (00).

If no level change occurs on both of the bit lines D0, D1, it can be said that the cell transistor is not at all connected with the bit lines D0, D1. So, it is possible to determine that stored information of the cell transistor is (01).

If potential variations occur on the bit lines D0, D1 respectively so that a potential difference between the bit lines D0 and D1 becomes small, it can be said that the cell transistor is connected with both of the bit lines D0 and D1. So, it is possible to determine that stored information of the cell transistor is (10).

If no level change occurs on the bit line D0 while the bit line D1 is increased in potential to reach a specific level which is lower than the High level by threshold voltage (Vt) of the cell transistor, it can be said that the cell transistor is connected with the word line and bit line D1. So, it is possible to determine that stored information of the cell transistor is (11).

Next, concrete operations of the aforementioned circuitry shown in FIG. 16 will be described in detail with reference to time charts of FIGS. 17A to 17I. Outline operations of the circuitry shown by the time charts are as follows:

In duration of t0–t1, the word line WL0 is activated so that data of the cell transistor Tr00 are read out. Then, data of the cell transistors Tr10, Tr20 and Tr30 are sequentially read out in duration of t2–t3, duration of t4–t5 and duration of t6–t7.

In a period of time (before time t0, for example) in which the clock signal CLK is in a Low level, both of the PMOS transistor and NMOS transistor, which are respectively connected with the bit lines D0 and D1, are turned ON. This initiates precharge to the bit line D0, so that the bit line D0 is increased in level to High. In addition, the bit line D1 is subjected to pull-down and is placed in a Low level. As described before, the bit lines D0, D1 are respectively connected to the sense amplifiers SA0, SA1, which are placed in through states to directly pass inputs to outputs. So, the sense amplifier SA0 provides a High-level output, while the sense amplifier SA1 provides a Low-level output.

In a period of time in which the clock signal CLK is in a High level, both of the PMOS and NMOS transistors, which are respectively connected with the bit lines D0, D1, are turned OFF. This stops the precharge to the bit line D0 and pull-down to the bit line D1. Thus, the circuitry of FIG. 16 starts to detect data being stored in the cell transistors.

At time t0 when the clock signal CLK is changed in level from Low to High (see FIG. 17A), the circuitry stops the precharge to the bit line D0 and pull-down to the bit line D1.

At the same time, the word line WL0 is increased in level from Low to High (see FIG. 17B), so that a High level is applied to the gate of the cell transistor Tr00, which is turned ON. As for the cell transistor Tr00, one terminal is connected with the bit line D0, and another terminal is connected with the GND line G0. So, the bit line D0 is connected with the GND line G0 by way of the cell transistor Tr00 which is turned ON. Thus, the bit line D0 is placed in a Low level.

No terminal of the cell transistor Tr00 is connected with the bit line D1. So, no level change occurs on the bit line D1, which remains at the Low level. That is, there is established a condition where D0=Low, D1=Low. Thus, it is possible to determine that stored information of the cell transistor Tr00 is (00).

The aforementioned values are subjected to decisions made by the sense amplifier SA0, SA1. Then, decision results of the sense amplifiers SA0, SA1 are input to the latches LA0, LA1 respectively. In the duration of t0–t1 in which the clock signal CLK is High, the latches LA0, LA1 are placed in through states respectively. So, outputs of the sense amplifiers SA0, SA1 are directly transmitted to latch signals DO0, DO1. The aforementioned values are retained by the latches LA0, LA1 in duration of t1–t2 in which the clock signal CLK is Low. In the duration of t1–t2, the bit line D0 is subjected to precharge and is increased in level to High, while the bit line D1 is subjected to pull-down and is placed in a Low level.

Next, at time t2 when the clock signal CLK is changed in level from Low to High, the circuitry stops the precharge to the bit line D0 and pull-down to the bit line D1.

At the same time, the word line WL1 is increased in level from Low to High (see FIG. 17C), so that a High level is applied to the gate of the cell transistor Tr10, which is turned ON. Since the cell transistor Tr10 is not connected with the bit lines D0, D1, no level changes occur on the bit lines D0, D1 even when the cell transistor Tr10 is turned ON. So, the bit line D0 remains at the High level, while the bit line D1 remains at the Low level. That is, there is established a condition where D0=High and D1=Low. Thus, it is possible to determine that stored information of the cell transistor Tr10 is (01).

The aforementioned values are subjected to decisions made by the sense amplifiers SA0, SA1 respectively. In duration of times t2–t3 in which the clock signal CLK is in the High level, both of the latches LA0, LA1 are placed in through states respectively. Hence, outputs of the sense amplifiers SA0, SA1 are directly transmitted to latch signals DO0, DO1. Those values are retained by the latches LA0, LA1 in duration of times t3–t4 in which the clock signal CLK is in a Low level. In the duration of times t3–t4, the bit line D0 is subjected to precharge and remains at the High level, while the bit line D1 is subjected to pull-down and remains at the Low level.

At time t4 when the clock signal CLK is changed in level from Low to High, the circuitry stops the precharge to the bit line D0 and pull-down to the bit line D1.

At the same time, the word line WL2 is increased in level from Low to High (see FIG. 17D), so that a High level is applied to the gate of the cell transistor Tr20, which is turned ON. Herein, the cell transistor Tr20 is connected with the bit lines D0 and D1. So, when the cell transistor Tr20 is turned ON, charges accumulated in the bit line D0 flow into the bit line D1 by way of the cell transistor Tr20. As a result, the bit line D0 is reduced in potential, while the bit line D1 is increased in potential. Finally, both of the potentials of the bit lines D0, D1 become close to an intermediate level between the High level and Low level. Thus, a potential difference between the bit lines D0, D1 becomes small.

Figure 17:
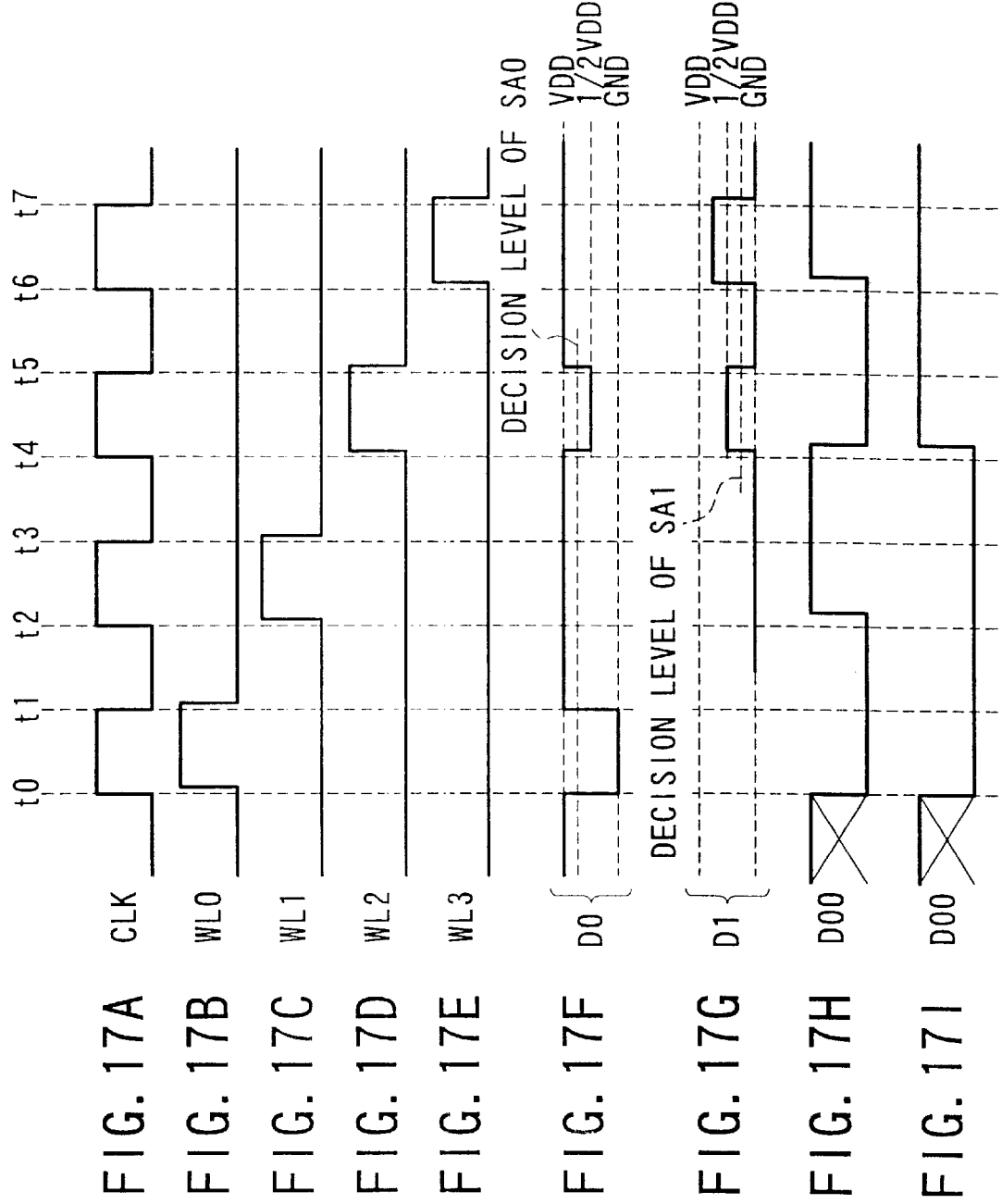
FIG. 17A is a time chart showing a clock signal CLK.
FIG. 17B is a time chart showing level variations of a word line WL0.
FIG. 17C is a time chart showing level variations of a word line WL1.
FIG. 17D is a time chart showing level variations of a word line WL2.
FIG. 17E is a time chart showing level variations of a word line WL3.
FIG. 17F is a time chart showing level variations of a bit line D0.
FIG. 17G is a time chart showing level variations of a bit line D1.
FIG. 17H is a time chart showing a latch signal DO0.
FIG. 17I is a time chart showing a latch signal DO1.

As described before, the logic decision level of the sense amplifier SA0 is set higher than the intermediate level (see FIG. 17F), while the logic decision level of the sense amplifier SA1 is set lower than the intermediate level (see FIG. 17G). Therefore, the sense amplifier SA0 outputs a Low level, while the sense amplifier SA1 outputs a High level. Thus, it is possible to determine that stored information of the cell transistor Tr20 is (10).

The aforementioned outputs of the sense amplifiers SA0, SA1 are respectively supplied to the latches LA0, LA1. In duration of times t4–t5 in which the clock signal CLK is in a High level, both of the latches LA0, LA1 are placed in through states respectively. Hence, the outputs of the sense amplifiers SA0, SA1 are directly transmitted to latch signals DO0, DO1. Those values are retained by the latches LA0, LA1 in duration of times t5–t6 in which the clock signal CLK is in a Low level. In the duration of times t5–t6, the bit line D0 is subjected to precharge and is increased in level to High, while the bit line D1 is subjected to pull-down and is decreased in level to Low.

Next, at time t6 when the clock signal CLK is increased in level from Low to High, the circuitry stops the precharge to the bit line D0 and pull-down to the bit line D1.

At the same time, the word line WL3 is increased in level from Low to High (see FIG. 17E), so that a High level is applied to the gate of the cell transistor Tr30, which is turned ON. Herein, the cell transistor Tr30 is not connected with the bit line D0 but is connected with the bit line D1 and word line WL3. So, even when the cell transistor Tr30 is turned ON, the bit line D0 is not changed in potential. In addition, the bit line D1 is connected with the word line WL3 by way of the cell transistor Tr30, so that the bit line D1 is increased in potential. Finally, the potential of the cell transistor Tr30 reaches a specific level, which is lower than the High level by threshold voltage of the cell transistor Tr30.

It is repeated that the logic decision level of the sense amplifier SA1 is set lower than the intermediate level. For this reason, both of the sense amplifiers SA0, SA1 outputs High levels. Thus, it is possible to determine that stored information of the cell transistor Tr30 is (11).

The sense amplifiers SA0, SA1 outputs the High levels, which are respectively input to the latches LA0, LA1. In duration of times t6–t7 in which the clock signal CLK is in a High level, both of the latches LA0, LA1 are placed in through states. Hence, the High-level outputs of the sense amplifiers SA0, SA1 are directly transmitted to latch signals DO0, DO1. Those values are retained by the latches LA0, LA1 in a period of time after time t7, in which the clock signal CLK is in a Low level.

The aforementioned operations are summarized as follows:

In synchronization with a level change of the clock signal CLK which is increased to High, activation is made on the word line being connected with the gate of the "target" cell transistor which is a target for reading out information. Then, the latch signals DO0, DO1 are read after a lapse of an appropriate time. Thus, it is possible to read out a 2-bit code stored in the target cell transistor.

[D] Embodiment 4

Figure 18:
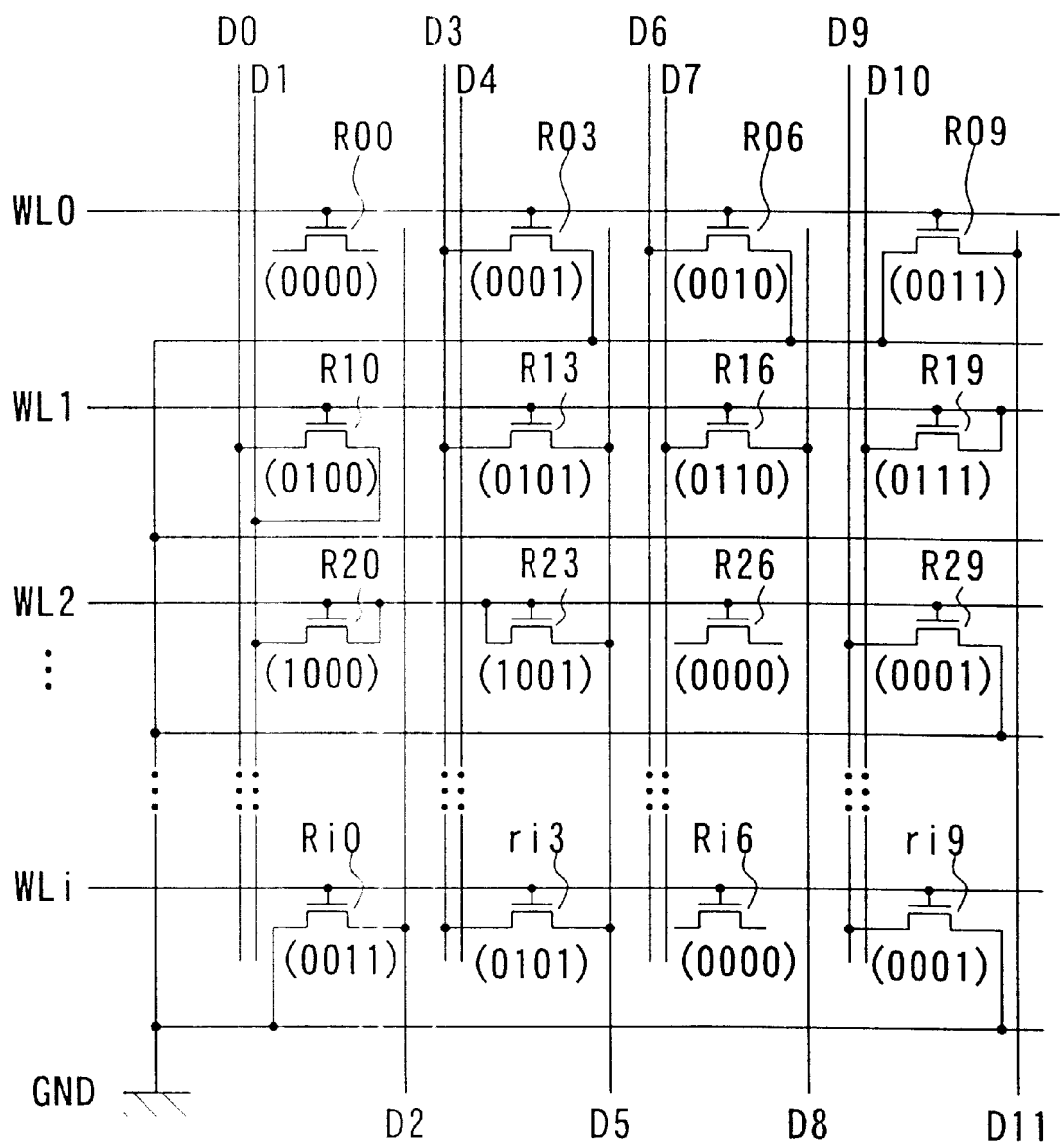
FIG. 18 is a circuit diagram showing a configuration of a multivalued mask ROM in accordance with embodiment 4 of the invention.

FIG. 18 is a circuit diagram showing a multivalued mask ROM in accordance with embodiment 4 of the invention. The present embodiment is designed such that each cell transistor is capable of storing ten kinds of information, which is realized by four bits. So, three bit lines and one GND line are wired to encompass each cell transistor. For example, bit lines D0, D1, D2 as well as a (branch of a) GND line and a word line WL0 are wired to encompass a cell transistor R00. That is, each cell transistor is encompassed by five lines in total. Therefore, it is possible to store each of ten kinds of information in each cell transistor in accordance with conditions of connections by which the five lines are adequately connected with two terminals (e.g., source and drain) of the cell transistor.

In case of FIG. 18, the multivalued mask ROM is formed with ten kinds of ROM codes, as follows:

(0000): None of the source and drain is connected with any of the lines.

(0001), (0010), (0011): One of the source and drain is connected with one bit line, while the other is connected with the GND line.

(0100), (0101), (0110): The source and drain are respectively connected with different bit lines.

(0111), (1000), (1001): One of the source and drain is connected with one bit line, while the other is connected with the word line.

The foregoing embodiment 2 of FIG. 8 is designed such that each cell transistor is capable of storing seven kinds of ROM codes. That is, the embodiment 2 uses three bit lines to provide a capability of creating eight kinds (i.e., $2^3=8$) of states or less. In addition, the embodiment 2 requires the specific post-process corresponding to "bit shaping" in which read data are subjected to calculations with respect to adjacent bit lines. In contrast, the embodiment 4 is capable of increasing a number of kinds of ROM codes to be more than the embodiment 2. Thus, it is possible to create eight or more kinds of states with respect to each cell transistor using three bit lines. As compared with the embodiment 2, the embodiment 4 is capable of using the three bit lines in a more effective manner.

As described heretofore, the embodiments are designed to use two or three bit lines being wired with respect to each cell transistor of the multivalued mask ROM. Of course, this invention is not limited to the aforementioned embodiments. That is, the multivalued mask ROM can be further modified to use "n" bit lines (where "n" is an integer not less than 2) as well as word lines and GND lines. Using those lines, it is possible to create a number of states with respect to each cell transistor, which is calculated as follows:

$$2 \cdot n + n \cdot \frac{n-1}{2} + 1$$

As described heretofore, the embodiments of the invention have a variety of technical features and effects, which are summarized as follows:

(1) The multivalued mask ROM is designed such that ROM codes are formed using contacts. So, it is possible to reduce TAT time in manufacture at revision of the ROM codes.

(2) Revision of ROM codes merely require modification of masks, which are used to form contacts. So, it is possible to reduce a number of masks being modified. For example, a four-valued mask ROM requires only one modified mask.

(3) A single value is required for thresholds of cell transistors of the multivalued mask ROM. So, it is unnecessary to perform ion implantation being used for changing the thresholds. Therefore, it is unnecessary to make consideration on the alignment accuracy of the ion implantation and spread diffusion of impurities. Thus, it is possible to reduce gate pitches of the cell transistors as minimally as possible to an extent that allows arrangement of contacts with minimum pitches.

(4) Integration of the cell transistors of the multivalued mask ROM is not limited by the alignment accuracy of the ion implantation and the spread diffusion of impurities. It is determined by the wiring pitches in the wiring process. So, different from the conventional technology, it is possible to expect improvements in the integration of the cell transistors when the fine manufacture of the CMOS process is developed.

(5) It is possible to simplify controls of voltages being applied to the word lines to read out ROM codes. In the conventional method which requires changes of the thresholds, it is necessary to control the word line to be at each of different potential levels, a number of which substantially coincides with a number of states being stored in each cell transistor. In contrast, this invention requires merely two potential levels, i.e., High level and Low level.

(6) ROM codes being actualized by this invention are capable of using a condition where one of the source and drain of the cell transistor is connected with the bit line while the other is connected with the word line. Thus, it is possible to increase an amount of information which can be written to each cell transistor. In addition, if the cell transistor of this invention is designed to store a same amount of information being stored in the cell transistor of the conventional technology, this invention is capable of simplifying read operation to read out such information as compared with the conventional technology. Concretely speaking, this invention is capable of reading out four-valued information (i.e., 2-bit ROM code) by a single read operation.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A multivalued mask ROM comprising:
   a plurality of word lines;
   a plurality of bit lines which are wired in directions crossing with the plurality of word lines respectively;
   a plurality of cell transistors, which are arranged in a matrix form at intersection points at which the word lines and the bit lines intersect; and
   at least one of a ground line being connected with ground potential and a power source line being connected with power source potential,
   wherein gates of the cell transistors which align along each of the word lines are connected with a same word line,
   one of source and drain of each of the plurality of cell transistors which align along each of the bit lines is connected with one of the bit line, the ground line or the power source line, while the other of the source and drain is connected with a line which is not connected with one of the source and drain within the bit line, ground line or power source line, and
   wherein all of the ground lines are connected together at a common ground potential level, and connections between the bit lines, ground lines and power source lines and source and drain of each cell transistor are made according to any one of the following combinations:
   (1) none of the source and drain are connected to any of the lines;
   (2) one of the source and drain is connected to one bit line, while the other is connected to the GND line; and
   (3) the source and drain are connected to adjacent bit lines respectively.

2. A multivalued mask ROM according to claim 1 wherein the plurality of cell transistors contain a cell transistor whose source and drain are not at all connected with the bit lines, the ground line and the power source line.

3. A multivalued mask ROM according to claim 1 wherein the plurality of cell transistors contain a cell transistor in which one of source and drain is connected with the ground line while other of the source and drain is connected with one of the bit lines and a cell transistor in which one of source and drain is connected with one of the bit lines while other of the source and drain is connected with a bit line which is not connected with one of the source and drain.

4. A multivalued mask ROM according to claim 3 wherein two bit lines are wired in proximity to the cell transistors which align along the bit lines, and wherein the cell transistors contain a cell transistor in which one of source and drain is connected with the ground line while other of the source and drain is connected with one of the two bit lines and a cell transistor in which one of source and drain is connected with one of the two bit lines while other of the source and drain is connected with other of the two bit lines.

5. A multivalued mask ROM according to claim 4 wherein one ground line is wired along the word line in proximity to the cell transistors which align along the word line.

6. A multivalued mask ROM according to claim 1 wherein connection by which one of the source and drain of the cell transistors is connected with one of the bit line the ground line and the power source line is made by a contact which is formed between one of a diffused source region and a diffused drain region and a conduction layer formed on a well region within an integrated circuit in which the cell transistor is formed.

7. A multivalued mask ROM according to claim 1 wherein connection by which one of the source and drain of the cell transistor is connected with the ground line is made vy a contact which is formed bewteen a border portion, being formed between one of a diffused source region and a diffused drain region and a first conduction layer, and a second conduction layer being formed on the first conduction layer, and wherein connection by which one of the source and drain of the cell transistor is connected with the bit line is made by a contact which is formed between one of the diffused source region and the diffused drain region and the second conduction layer.

8. A multivalued mask ROM according to claim 1 wherein a first conduction layer which acts as the ground line is formed at a position which is adjacent to one of a diffused source region and a diffused drain region which are formed on a well region within an integrated circuit in which the cell transistor is formed, a second conduction layer is formed above one of the diffused source region and the diffused drain region as well as above a border portion being formed between one of the diffused source region and the diffused drain region and the first conduction layer, and a third conduction layer which acts as the bit line is formed above the second conduction layer, and wherein the second conduction layer being formed above one of the diffused source region and the diffused drain region is connected with the third conduction layer, while the second conduction layer being formed above the border portion between one of the diffused source region and the diffused drain region and the first conduction layer is not connected with the third conduction layer.

9. A reading method for a multivalued mask ROM comprising the steps of:
   providing a multivalued mask ROM made according to claim 4,
   precharging the two bit lines;
   activating a word line being connected with a gate of a target cell transistor whose stored information is to be read out;

detecting potential levels of the two bit lines; and if both of two bit lines are at High levels, grounding one of the two bit lines while detecting a potential level of other of the two bit lines.

10. A multivalued mask ROM according to claim 1 wherein one of the source and drain of the cell transistor is connected with a work line while other of the source and drain is connected with one of the bit lines.

11. A reading method for a multivalued mask ROM comprising the steps of:

providing a multivalued mask ROM made according to claim 1 in which one of the source and drain of the cell transistor is connected with the word line while other of the source and drain is connected with one of the bit lines;

precharging a prescribed bit line while grounding other bit line other than the prescribed bit line within the plurality of bit lines;

stopping precharge to the prescribed bit line and grounding to the other bit line;

activating a word line being connected with a gate of a target cell transistor whose stored information is to be read out;

comparing a potential level of the prescribed bit line with a first decision level;

comparing a potential level of the other bit line with a second decision level; and reading out the stored information of the target cell transistor on the basis of comparison results.

12. A reading method for a multivalued mask ROM comprising the steps of:

providing a multivalued mask ROM made according to claim 1 in which one of the source and drain of the cell transistor is connected with the word line while other of the source and drain is connected with one of the bit lines;

precharging a prescribed bit line while grounding other bit line other than the prescribed bit line within the plurality of bit lines;

stopping precharge to the prescribed bit line and the grounding to the other bit line;

activating a word line being connected with a gate of a target cell transistor whose stored information is to be read out;

comparing a potential level of the prescribed bit line with a first decision level;

comparing a potential level of the other bit line with a second decision level; and reading out the stored information of the target cell transistor on the basis of comparison results, wherein the first decision level is set higher than an intermediate level between a power source potential and a ground potential, while the second decision level is set lower than the intermediate level.

13. A multivalued mask ROM comprising:

a plurality of word lines which are wired to align in directions of rows;

a plurality of bit lines which are wired to align in directions of columns;

a plurality of ground lies which are wired to align in the directions of rows;

a plurality of cell transistors which are arranged in a matrix form consisting of the rows and the columns in connection with the word lines and the bit lines in such a way that each of the cell transistors is encompassed by a word line, a ground line and at least two bit lines and in such a way that gates of the cell transistors aligning in a same direction of a row are connected with a same word line, so that stored invention being stored in each cell transistor is defined by a condition of connection by which source and drain of each cell transistor are connected or disconnected with the word line, the ground and the at least two bit lines; and a read circuit which controls precharge to one of the at least two bit lines and pull-down to other of the at least two bit lines and which detects level variations that occur on the at least two bit lines to determine stored information of each cell transistor to be read out and wherein all of the ground lines are connected together at a common ground potential level, and connections between the bit lines, ground lines and power source lines and source and drain of each cell transistor are made according to any one of the following combinations:

(1) none of the source and drain are connected to any of the lines;

(2) one of the source and drain is connected to one bit line, while the other is connected to the GND line; and (3) the source and drain are connected to adjacent bit lines respectively.

14. An integrated circuit for a multivalued mask ROM comprising:

a substrate;

a well region which is formed on the substrate;

two n+ regions which respectively act as a source and a drain of a cell transistor and which is formed on the well region;

a gate electrode which acts as a word line and which is at a position between the n+ regions on the well region;

a ground line which is formed adjacent to one of the n+ regions on the well region;

two regions of first-layer metal, one of which is formed above one of the n+ regions and other of which is formed above a border portion between the ground line and its adjacent n+ region; and a second-layer metal which acts as a bit line and which is formed above the regions of first-layer metal, wherein a connection between one of the source and drain of the cell transistor and the ground line is made by a contact which is formed between the border portion and its above region first-layer metal, while a connection between one of the source and drain of the cell transistor and the bit line is made by a stacked via containing a contact, which is formed between one of the n+ regions and its above region of first-layer metal, and a via which is formed between the region of first-layer metal and the second-layer metal; and wherein all of the ground lines are connected together at a common ground potential level, and connections between the bit lines, ground lines and power source lines and source and drain of each cell transistor are made according to any one of the following combinations:

(1) none of the source and drain are connected to any of the lines;

(2) one of the source and drain is connected to one bit line, while the other is connected to the GND line; and (3) the source and drain are connected to adjacent bit lines respectively.

15. A reading method for a multivalued mask ROM comprising the steps of providing a multivalued ROM made according to claim 1 and containing a plurality of cell transistors each of which is encompassed by a word line, a ground line, a first bit line and a second bit line;

performing precharge to the first bit line and pull-down to the second bit line in synchronization with first duration of a clock signal which is in a first level, so that the first bit line is increased in level to High while the second bit line is decreased in level to Low;

stopping the precharge to the first bit line and the pull-down to the second bit line in synchronization with second duration of the clock signal which is in a second level;

activating the word line being connected with a target cell transistor whose stored information is to be read out; and detecting a level of the first bit line and a level of the second bit line to determine the stored information of the target cell transistor.

16. The reading method for the multivalued mask ROM according to claim 15 wherein a gate of the cell transistor is connected with the word line being activated, and wherein a two-bit code (00) is determined as the stored information of the cell transistor whose source and drain are not at all connected with any of the ground line and bit lines, a two-bit code (01) is determined as the stored information of the cell transistor whose source and drain are respectively connected with the first bit line and the ground line, a two-bit code (10) is determined as the stored information of the cell transistor whose source and drain are respectively connected with the ground line and the second bit line, and a two-bit code (11) is determined as the stored information of the cell transistor whose source and drain are respectively connected with the first and second bit lines.

17. A reading method for a multivalued mask ROM comprising the steps of:

providing a multivalued mask ROM made according to claim 1 and containing a plurality of cell transistors each of which is encompassed by a word line, a ground line, a first bit line and a second bit line;

performing precharge to the first bit line and pull-down to the second bit line in synchronization with first duration of a clock signal which is in a first level, so that the first bit line is increased in level to High while the second bit line is decreased in level to Low;

stopping the precharge to the first bit line and the pull-down to the second bit line in synchronization with second duration of the clock signal which is in a second level;

activating the word line being connected with a target cell transistor whose stored information is to be read out;

detecting a level of the first bit line being compared with a first decision level to determine a first value, which is retained in the first duration of the clock signal; and detecting a level of the second bit line being compared with a second decision level to determine a second value, which is retained in the first duration of the clock signal, wherein the stored information of the target cell transistor is defined by a combination of the first value and the second value.

18. The reading method for the multivalued mask ROM according to claim 17 wherein a gate of the cell transistor is connected with the word line being activated, and wherein a two-bit code (00) is determined as the stored information of the cell transistor whose source and drain are respectively connected with the first bit line and the ground line, a two-bit code (01) is determined as the stored information of the cell transistor whose source and drain are not at all connected with the ground line and bit lines, a two-bit code (10) is determined as the stored information of the cell transistor whose source and drain are respectively connected with the first and second bit lines, and a two-bit code (11) is determined as the stored information of the cell transistor whose source and drain are respectively connected with the word line and the second bit line.

19. A reading method for the multivalued mask ROM comprising the steps of:

providing a multivalued ROM made according to claim 5;

precharging the two bit lines;

activating a word line being connected with a gate of a target cell transistor whose stored information is to be read out;

detecting potential levels of the two bit lines; and if both of two bit lines are a High levels, grounding one of the two bit lines while detecting a potential level of other of the two bit lines.

* * * * *

UNITED STATES PATENT AND TRADEMARK OFFICE
CERTIFICATE OF CORRECTION

PATENT NO. : 6,243,284 B1
DATED : June 5, 2001
INVENTOR(S) : Kouichi Kumagai

It is certified that error appears in the above-identified patent and that said Letters Patent is hereby corrected as shown below:

<u>Title page,</u>
Item [30], insert -- Feb. 8, 1999 (JP) 11-030680 --.

<u>Column 22,</u>
Line 32, "vy" should be -- by --.

Signed and Sealed this

Twenty-third Day of July, 2002

*Attest:*

JAMES E. ROGAN
*Attesting Officer*     *Director of the United States Patent and Trademark Office*